United States Patent
Larsen

(10) Patent No.: US 9,882,529 B2
(45) Date of Patent: Jan. 30, 2018

(54) MULTI-STEP DRIVE SIGNAL FOR PIN DIODE BASED RF AMPLITUDE MODULATORS

(71) Applicant: Honeywell International Inc., Morristown, NJ (US)

(72) Inventor: David Larsen, Woodinville, WA (US)

(73) Assignee: Honeywell International Inc., Morris Plains, NJ (US)

( * ) Notice: Subject to any disclaimer, the term of this patent is extended or adjusted under 35 U.S.C. 154(b) by 870 days.

(21) Appl. No.: 14/293,945

(22) Filed: Jun. 2, 2014

(65) Prior Publication Data

US 2015/0349713 A1  Dec. 3, 2015

(51) Int. Cl.
| | |
|---|---|
| H03C 1/00 | (2006.01) |
| H03C 1/14 | (2006.01) |
| H03K 3/57 | (2006.01) |
| H04L 25/03 | (2006.01) |
| H04L 25/02 | (2006.01) |
| H03K 4/02 | (2006.01) |
| H03K 4/94 | (2006.01) |
| H03K 17/74 | (2006.01) |

(52) U.S. Cl.
CPC ............... *H03C 1/14* (2013.01); *H03K 3/57* (2013.01); *H03K 4/02* (2013.01); *H03K 4/94* (2013.01); *H03K 17/74* (2013.01); *H04L 25/02* (2013.01); *H04L 25/03828* (2013.01)

(58) Field of Classification Search
CPC . H03C 1/14; H03K 4/02; H03K 17/74; H03K 4/94; H03K 3/57; H04L 25/02; H04L 25/03828

USPC ............ 332/149; 455/108; 341/177; 330/10; 435/285.2; 307/82, 84; 375/219, 353
See application file for complete search history.

(56) References Cited

U.S. PATENT DOCUMENTS

| | | | |
|---|---|---|---|
| 4,882,504 A | 11/1989 | Petitjean et al. | |
| 5,003,195 A | * 3/1991 | Stelling | H03K 17/66 327/170 |

(Continued)

FOREIGN PATENT DOCUMENTS

DE  3708759 A1  9/1988

OTHER PUBLICATIONS

Response to the Extended European Search Report dated Oct. 29, 2015, from counterpart European Application No. 15167658.2, filed May 27, 2016, 13 pp.

(Continued)

*Primary Examiner* — Arnold Kinkead
(74) *Attorney, Agent, or Firm* — Shumaker & Sieffert, P.A.

(57) ABSTRACT

Methods and devices are disclosed driving one or more P-Intrinsic-N (PIN) diodes by receiving an input and generating a plurality of pulses based on the input, a first pulse of the plurality of pulses controls a rise time of an RF envelope generated by an RF interface and a second pulse of the plurality of pulses controls a fall time of the RF envelope generated by the RF interface. The methods and devices may further be disclosed combining the plurality of pulses to generate a drive signal, delivering the drive signal to the RF interface including one or more PIN diodes, and generating the RF envelope by driving the one or more PIN diodes with the drive signal, and the amplitude or a pulse width of the first pulse is independently adjustable from the amplitude or the pulse width of the second pulse.

15 Claims, 15 Drawing Sheets

(56) References Cited

U.S. PATENT DOCUMENTS 5,204,551 A * 4/1993 Bjornholt ............. H03K 17/691
327/172
5,214,315 A 5/1993 Dunnam

OTHER PUBLICATIONS

Schubert, M. et al., "Feature Oriented Analog Waveform Behavioral Modeling," University of Applied Sciences, retrieved from https://hps.hs-regensburg.de/scm39115/homepage/research/mixed/mixed_publications/1998_bmas_wave.pdf on Nov. 19, 2013, 8 pp.
"Using a Function/Arbitrary Waveform Generator to Generate Pulses," Agilent Technologies, Application Note 1437, Dec. 13, 2002, 4 pp.
Extended Search Report from counterpart European Application No. 15167658.2, dated Oct. 29, 2015, 7 pp.

\* cited by examiner

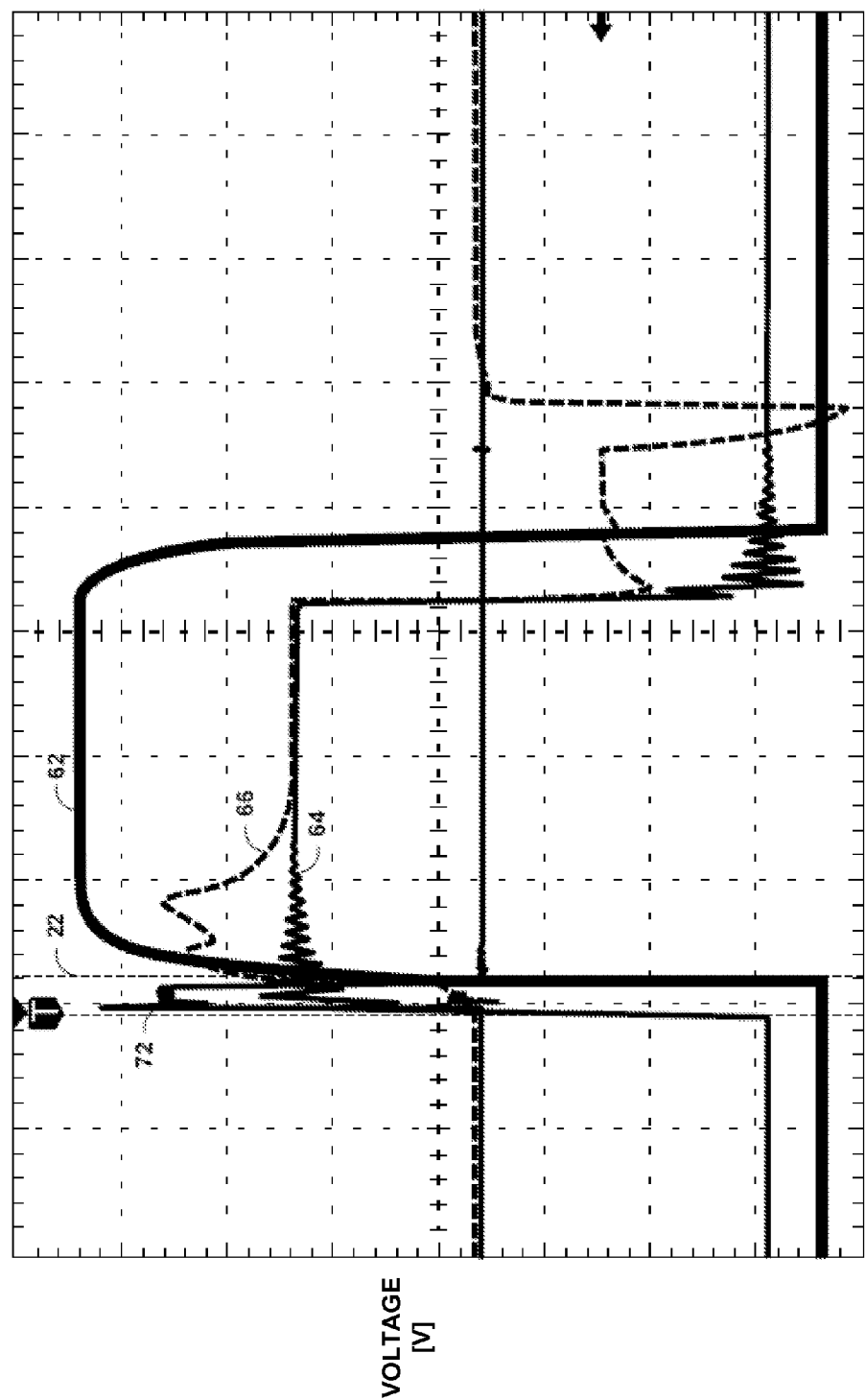

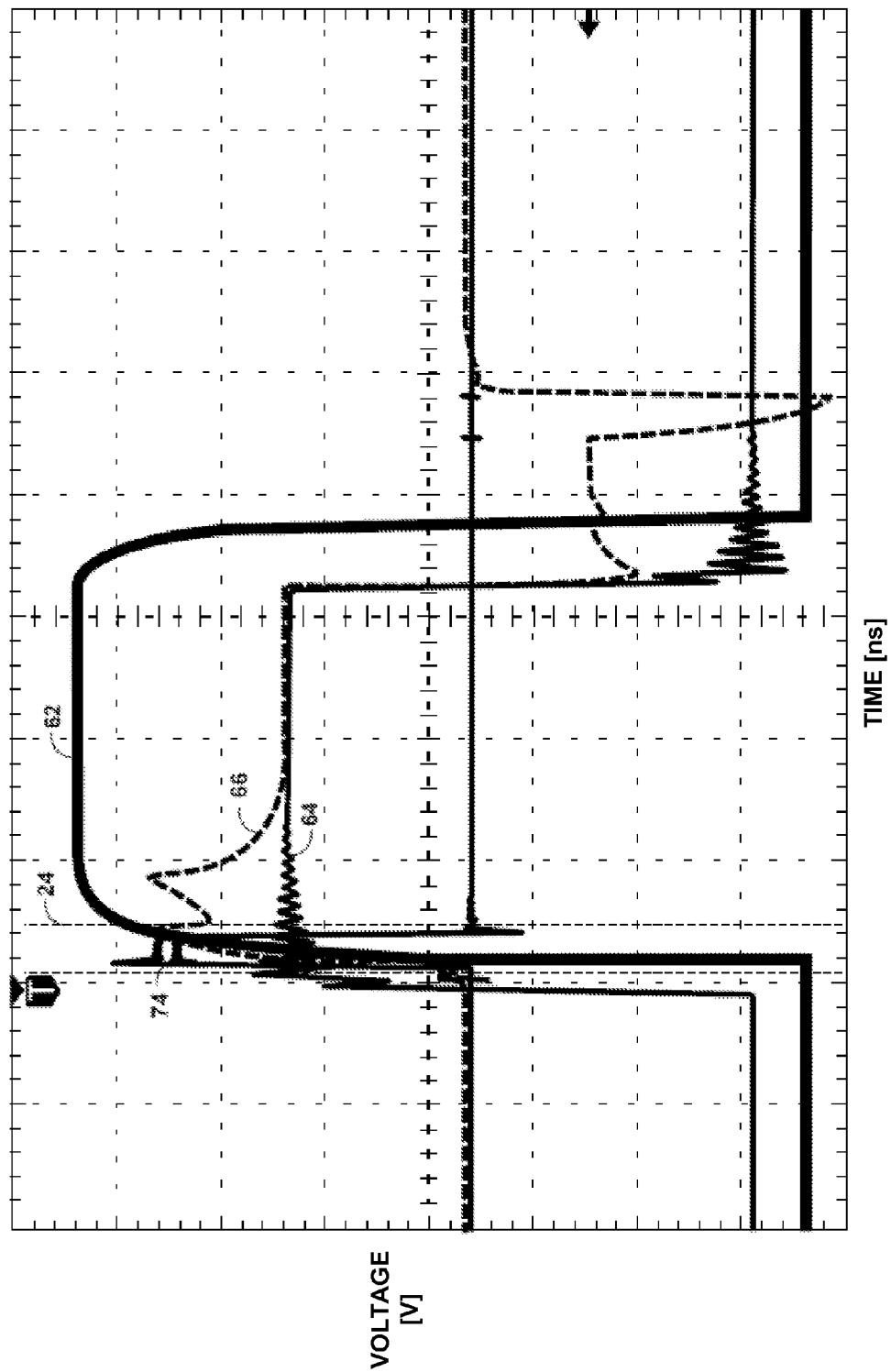

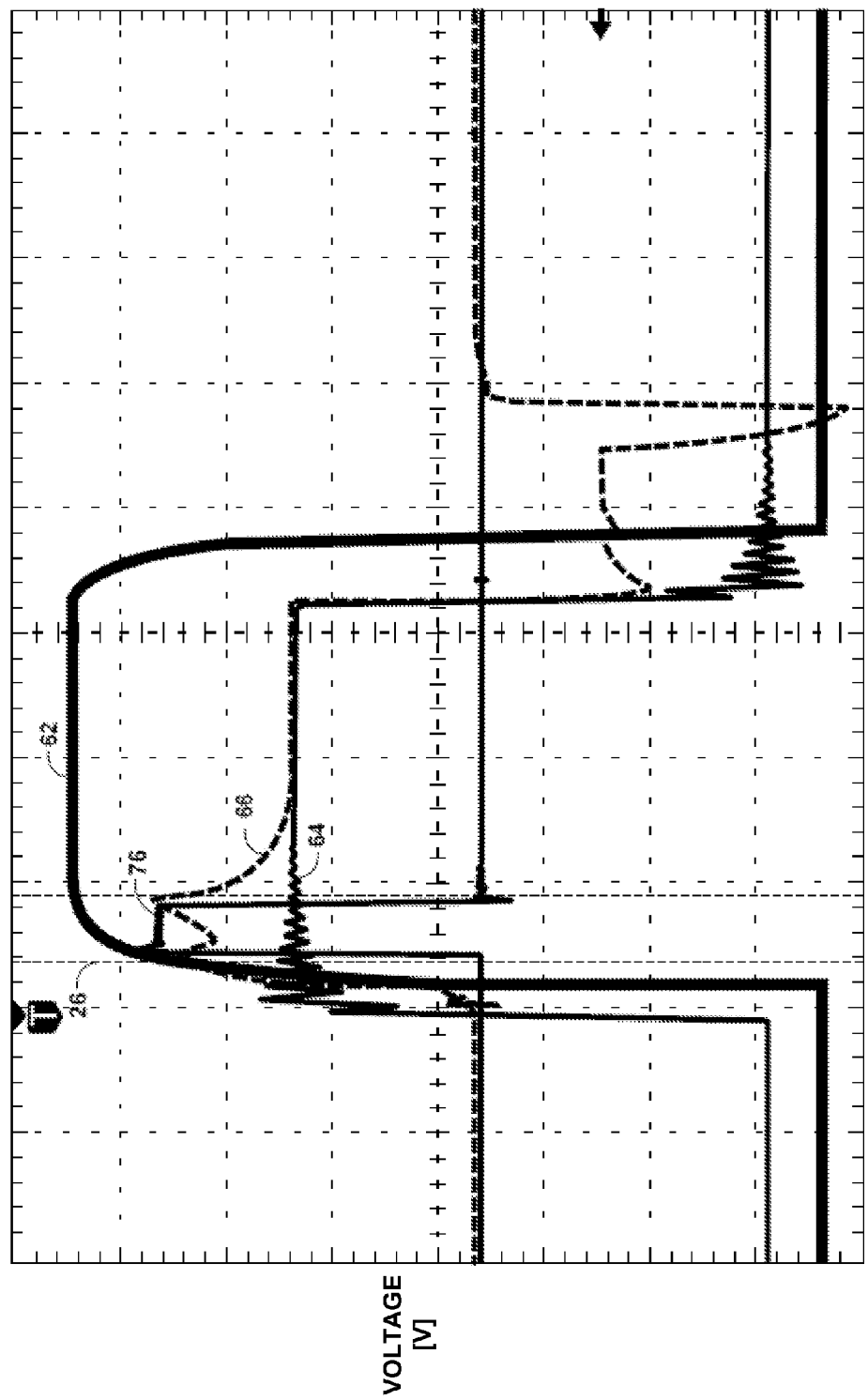

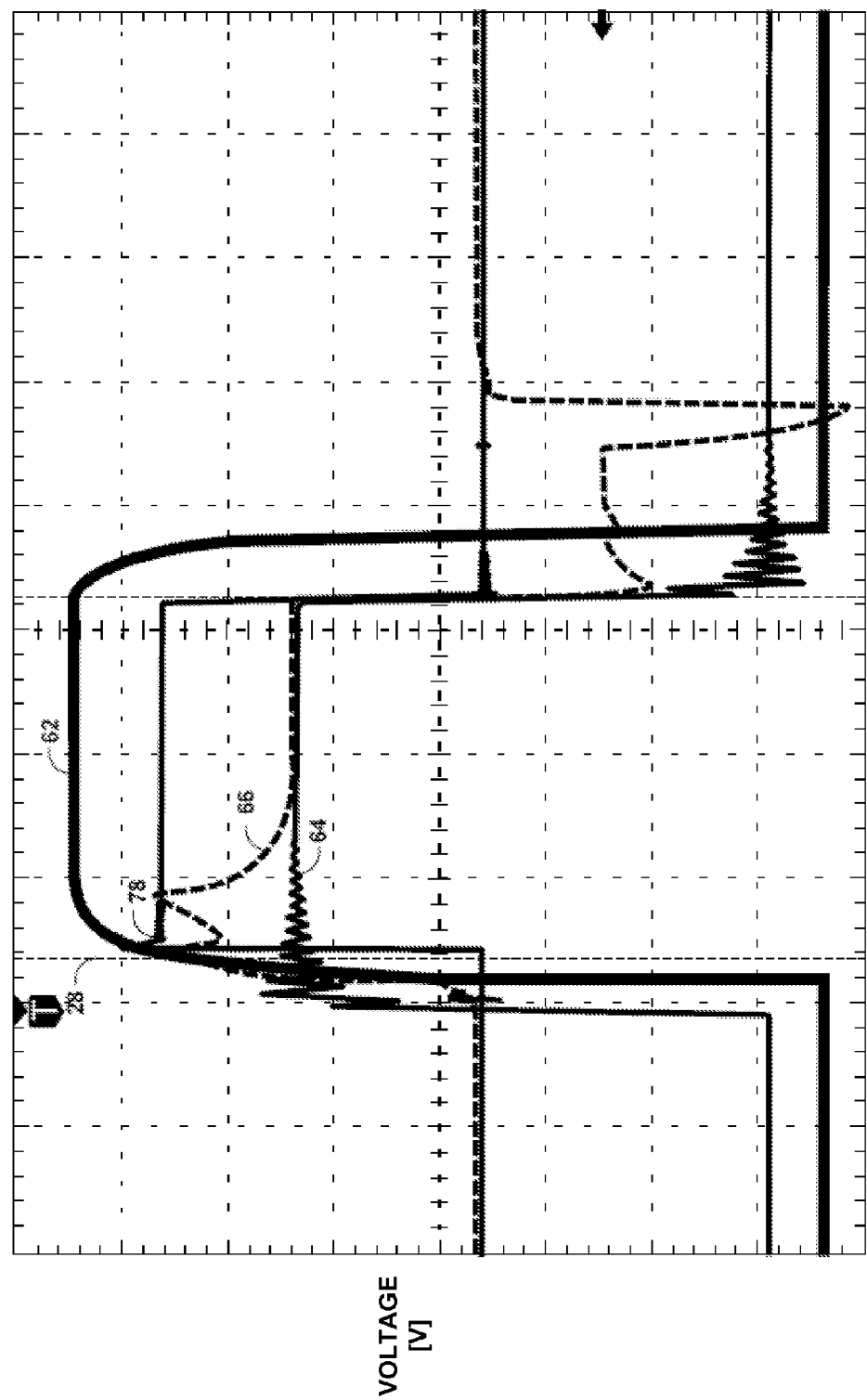

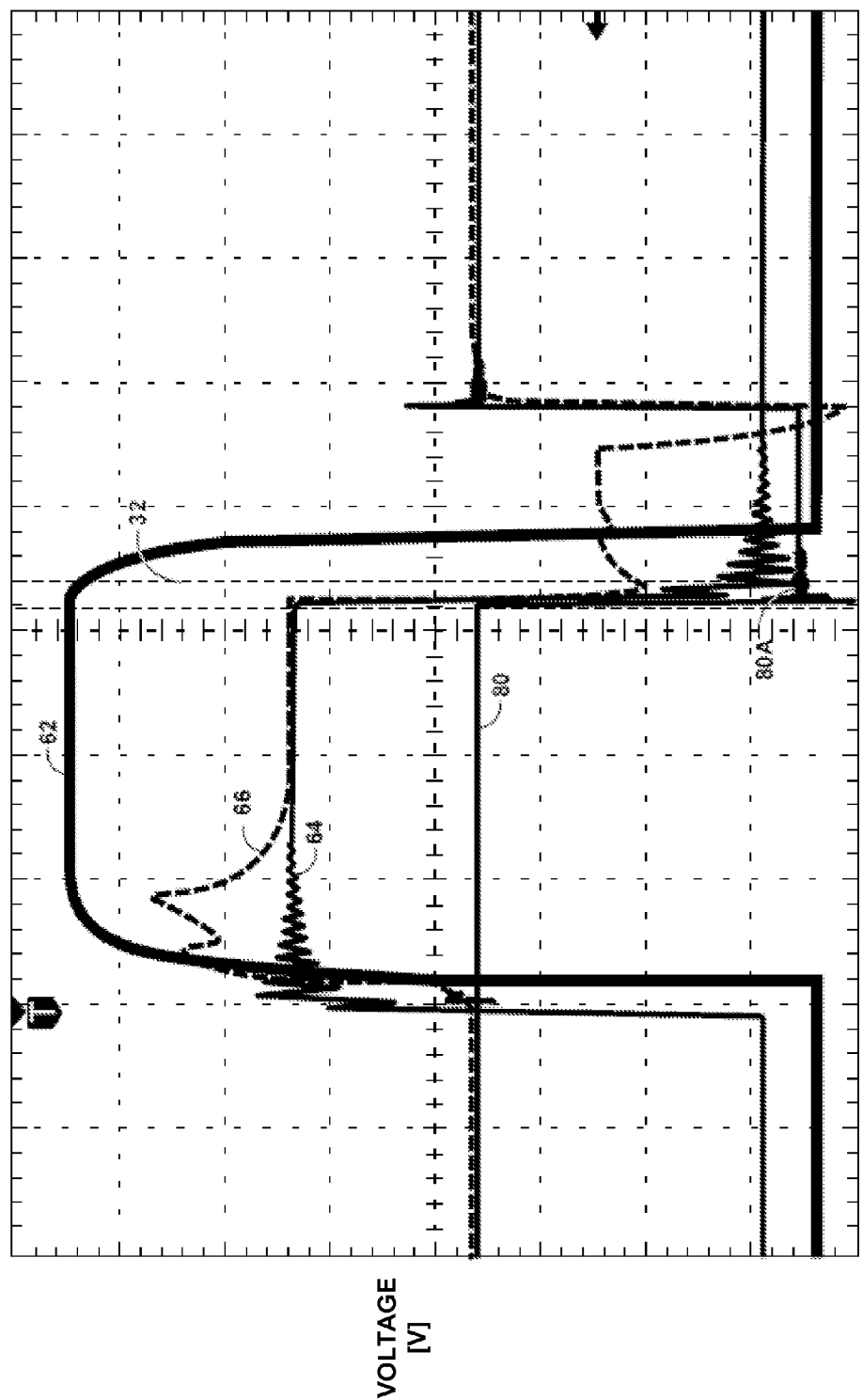

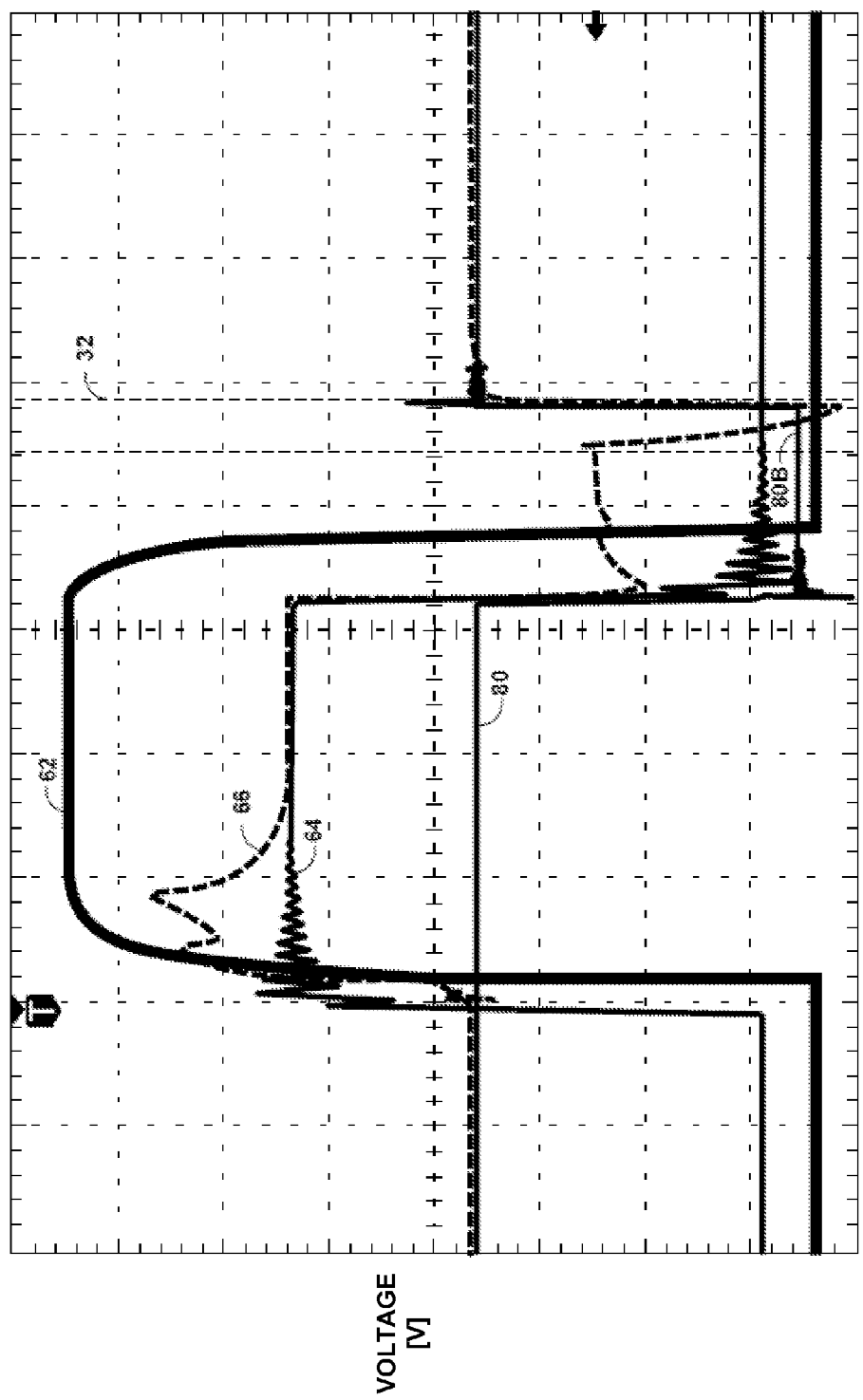

| Parameter | Specification |
|---|---|
| Rise Time | 50-100ns |
| Fall Time | 50-200ns |
| Pulse Width | 700-900ns |
| Pulse Delay | 150ns |
| Max Droop | +/-0.5dB |
| Max Pulse width | 30us |
| Min Pulse Width | 0.45us |
| Temperature Range | -55C to 85C |
| Frequency Range | 1030-1090MHz |

FIG. 7

MULTI-STEP DRIVE SIGNAL FOR PIN DIODE BASED RF AMPLITUDE MODULATORS

TECHNICAL FIELD

The disclosure relates to RF modulators with P-Intrinsic-N (PIN) diodes.

BACKGROUND

P-Intrinsic-N diodes (PIN) diodes include an intrinsic semiconductor region between the P-type semiconductor and the N-type semiconductor region of a typical PN diode. The intrinsic region is different than an ordinary PN diode because the intrinsic region makes the PIN diode suitable for fast switching. The intrinsic region of the PIN diode operates by receiving injected charge carriers from the "P" and "N" regions, and after the intrinsic region of the PIN reaches equilibrium (i.e., where the number of electrons is equal to the number of holes in the intrinsic region) the PIN diode will conduct current. Among other applications, PIN diodes are commonly used as Radio Frequency (RF) switches, attenuators, and photodetectors.

SUMMARY

In general, various examples of this disclosure are directed to a multi-step drive signal for PIN diode based RF amplitude modulators. Various examples of this disclosure may allow the independent adjustment of the rise time, fall time, and width of an RF pulse. Various examples of this disclosure may also enhance the capability of reaching rise and fall time specifications along with other specifications of a desired RF pulse.

In one example, the disclosure is directed to a method of driving one or more P-Intrinsic-N (PIN) diodes, by receiving an input, generating a plurality of pulses based on the input, wherein a first pulse of the plurality of pulses controls a rise time of an RF envelope generated by an RF interface and a second pulse of the plurality of pulses controls a fall time of the RF envelope generated by the RF interface, combining the plurality of pulses to generate a drive signal, delivering the drive signal to the RF interface including one or more PIN diodes, and generating the RF envelope by driving the one or more PIN diodes with the drive signal, wherein at least one of an amplitude or a pulse width of the first pulse is independently adjustable from an amplitude or a pulse width of the second pulse.

In another example, the disclosure is directed to a RF modulator device driving one or more P-Intrinsic-N (PIN) diodes to generate an RF envelope, the RF modulator device includes a first circuitry configured to receive an input and generate a plurality of pulses based on the input, a first pulse of the plurality of pulses controls a rise time of an RF envelope generated by the RF interface and a second pulse of the plurality of pulses controls a fall time of the RF envelope generated by the RF interface, and at least one of an amplitude or a pulse width of the first pulse is independently adjustable from an amplitude or a pulse width of the second pulse. The RF modulator device further includes a second circuitry configured to receive and combine the plurality of pulses to generate a drive signal. The RF modulator device further includes a third circuitry including one or more PIN diodes, the second circuitry delivers the drive signal to drive the one or more PIN diodes, and the one or more PIN diodes generate an RF envelope.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 5A-5G are conceptual diagrams illustrating example pulses from the plurality of pulses generated by the multi-step pulse generation module.

FIG. 7 is a chart illustrating an example of the specifications for the RF envelope of the RF modulator.

DETAILED DESCRIPTION

Figure 1:
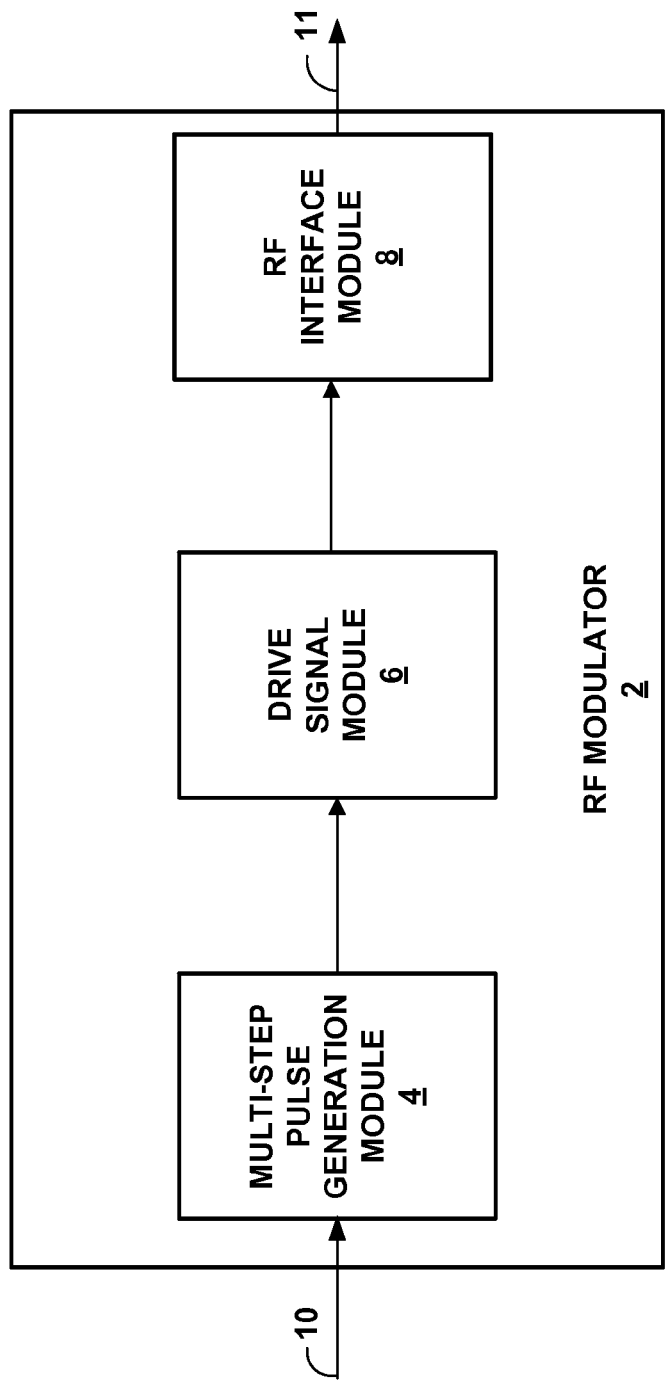
FIG. 1 is a block diagram illustrating an RF pulse modulator that includes a multi-step pulse generation module, a drive signal module, a RF interface, and an input.

PIN diodes used in many pulse modulators have significant inherent lot-to-lot and temperature-dependent variation in their characteristics. To ensure that the pulse modulators using PIN diodes behave consistently across lot codes and temperature, changes must be made in the control signal to track the variation of these diodes. In some applications, such as some Traffic Collision Awareness and Avoidance (TCAS) systems, the rise time, fall time, pulse width, pulse delay, and on-off isolation of the RF modulator must meet relatively stringent specifications. In order to consistently meet these specifications the control signal to the PIN diodes is adjusted by either an automatic or manual procedure. The challenge is that the current types of drive signals adjust all of these parameters simultaneously (i.e. as the drive signal is adjusted so that the envelope of an RF pulse meets a given rise time, but the fall time and pulse width is also changed). This makes targeting the specifications difficult and generally results in a trade-off in each of the specifications instead of the PIN diodes reaching their optimum values.

PIN diodes contain variations from manufacturing, geometry, and doping on the semiconductors. Due to these variations, a control (i.e., drive) signal will not interact with any two PIN diodes in the exact same manner. In general, the drive signals to PIN diodes of radio frequency (RF) modulators have Gaussian, trapezoidal or rectangular pulse shapes. The rise and fall time, amplitude, pulse delay, and/or DC offset of the drive signals are adjusted to compensate for the different PIN diode characteristics caused by the manufacturing and temperature-related variations. However, the adjustments made to the rise and fall time, amplitude, and/or DC offset of the drive signal are dependent on each other, and cannot be controlled and/or adjusted independently.

In general, an RF interface of the RF modulator may be structured to use series control and shunt control of the PIN diodes in the RF interface. In some examples, series control may be used to control the PIN diode(s) in series and in the path of the RF signal. In other examples, shunt control may be used to control the PIN diode(s) that are connected to ground after the PIN diode(s) in series, and may be used to isolate the RF signal from any leakage by the PIN diode(s) in the path of the RF signal. To adjust for the variations from manufacturing, changing the DC offset of the series and shunt control sets the rise and fall time of the PIN diode(s). Increasing the DC offset turns a PIN diode on faster (i.e., decreases the rise time) and turns the PIN diode off slower (i.e., increases the fall time). Conversely, decreasing the DC offset turns a PIN diode on slower (i.e., increases the rise time) and turns the PIN diode off faster (i.e., decreases the fall time). As such, the rise time and the fall time are dependent on each other, and changing the DC offset also changes the amount of isolation or insertion loss, whether the PIN diodes are completely "on" or "off." Isolation can cause distortion on the back side of the series and shunt control signals.

This disclosure provides a means for varying subsections of the drive signal, which may remove the dependence between the rise time and the fall time. Varying the subsections of the drive signal by independently adjusting the amplitude and/or pulse widths of each pulse in order to consistently meet rise time and fall time specifications for RF transmission applications, such as traffic collision avoidance systems. Varying the subsections of the drive signal may also reduce the effects caused by the variations in the PIN diode(s) from the manufacturing process, geometry, and the doping of the semiconductor. Each subsection of the drive (i.e., "control") signal has its own function to apply to the PIN diode(s), and is combined to create an overall drive signal.

One potential benefit of the process of using a plurality of pulses "superpositioned" to generate a drive signal by combining pulses to drive PIN diode pulse modulators is that the drive signal is not designed to look like the desired RF envelope (Gaussian, trapezoidal, rectangular, etc.) but rather focuses on adjusting the rate at which the charge carriers move on and off the intrinsic region of the PIN diode(s) to control the shape of the RF envelope.

FIG. 1 is a block diagram illustrating an RF pulse modulator 2 that includes multi-step pulse generation module 4, drive signal module 6, RF interface 8, and input 10. In the example of FIG. 1, based on a desired rise time and a desired fall time, a first circuitry, such as multi-step pulse generation module 4 receives an input, such as input 10 described below, and generates a plurality of pulses which is sent to a second circuitry, such as drive signal module 6 that buffers the overall drive signal with the current sourcing/sinking capabilities needed to drive the third circuitry, such as RF interface 8 which includes at least one PIN diode used to generate an RF transmission and/or RF pulse. In this disclosure, terms such as first circuitry, second circuitry, and third circuitry are intended to describe different circuit functions and not necessarily discrete circuits. While the first, second, and third circuitry may in some instances correspond to separate circuits, it is also contemplated that in some implementations the first, second, and third circuitry may be highly or partially integrated.

In RF pulse modulator 2, multi-step pulse generation module 4 receives input 10 and generates a plurality of pulses based on input 10. Drive signal module 6 receives and combines the plurality of pulses to generate the drive signal. Drive signal module 6 delivers the drive signal to RF interface module 8, which may include one or more PIN diodes. RF interface 8 generates the RF envelope by driving the one or more PIN diodes with the drive signal. A first pulse of the plurality of pulses may control a rise time of an RF envelope generated by RF interface module 8, and a second pulse of the plurality of pulses may control a fall time of the RF envelope generated by RF interface module 8. At least one of an amplitude or a pulse width of the first pulse and the second pulse are independently adjustable (i.e., tunable).

Multi-step generation module 4 may include either analog and/or digital components that generate the plurality of pulses to create a desired rise time and a desired fall time independent of each other. In one example, as described below in FIGS. 2A and 2B, multi-step pulse generation module 4 may include analog components, such as resistors, potentiometers, thermistors, capacitors, and operational amplifiers, along with discrete digital logic components, such as inverters, AND gates, and NOR gates. In some examples, the digital components may include an analog-to-digital converter or a programmable logic device.

Figure 4:
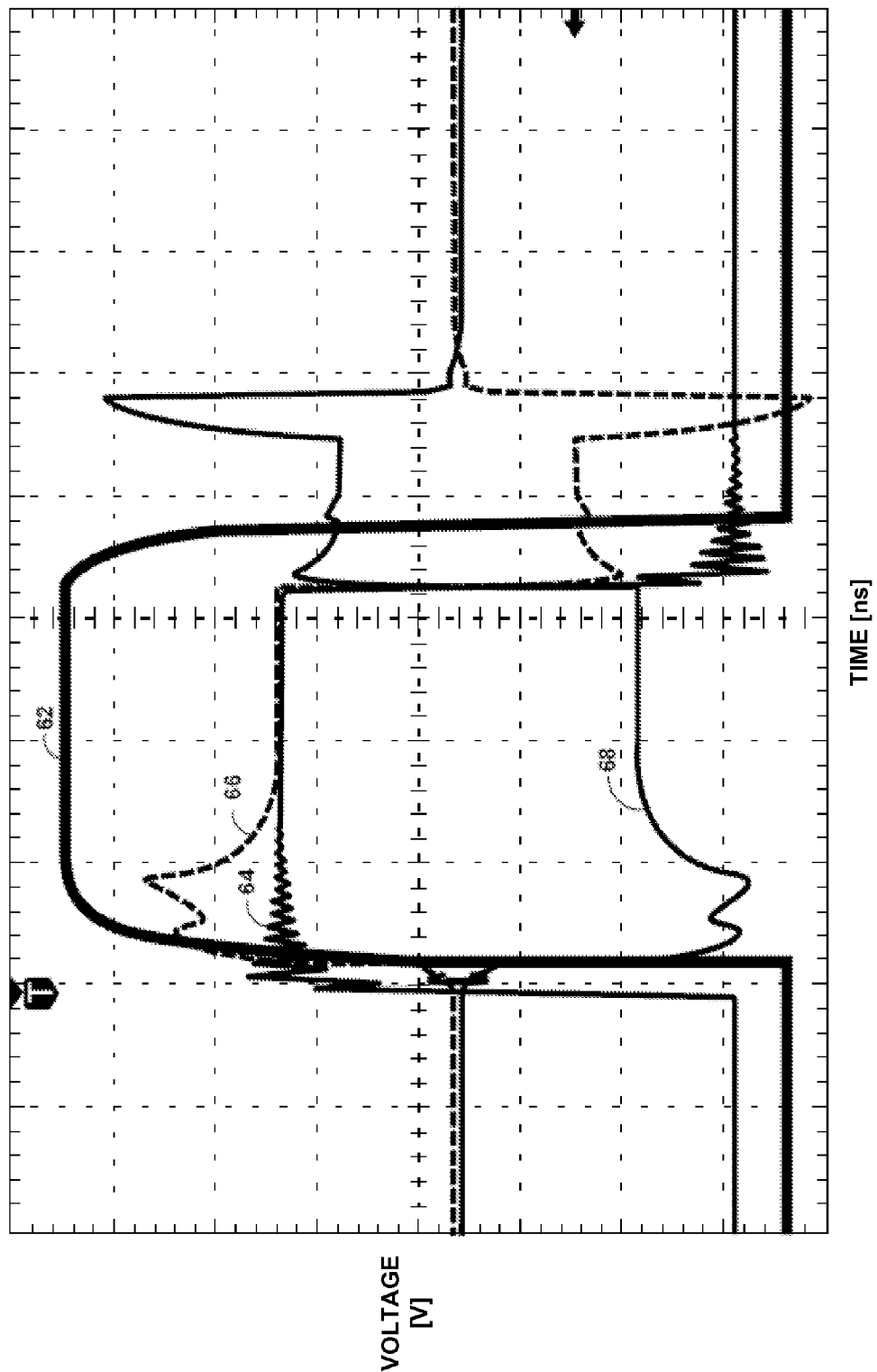
FIG. 4 is a conceptual diagram illustrating an example of a drive signal, an inverted drive signal, a RF envelope, and an input.

In some examples, multi-step pulse generation module 4 may generate two pulses, a first pulse controlling a rise time of an RF pulse (i.e., an RF envelope, such as RF envelope 62 as described in FIG. 4) and a second pulse representing a fall time of the RF pulse. In some examples, the two pulses generated by multi-step pulse generation module 4 may be adjusted (i.e., "tuned") in amplitude and/or width by the analog circuitry and/or digital components in the multi-step pulse generation module 4 to achieve a desired rise time and a desired fall time of the RF envelope. In some examples, the first pulse may be independent to the second pulse, such that the amplitude and width can each be independently adjusted for the first pulse separate from the amplitude and width of the second pulse. It is contemplated that the first pulse and the second pulse may be comprised of a plurality of additional pulses. As used in this disclosure, the terms first pulse, second pulse, etc. are intended to differentiate between different pulses and do not necessarily imply any ordinal or temporal relationship relative to each other or relative to other pulses.

In some examples, multi-step pulse generation module 4 may also generate, in addition to the first pulse and the second pulse representing a desired rise time and a desired fall time, a plurality of optional pulses. In some examples, the plurality of optional pulses may be independently adjustable in the same manner as the first and second pulses are independently adjustable. For example, multi-step pulse generation module 4 may generate another pulse to achieve a desired on-time of the RF pulse (e.g., a desired pulse width of the drive signal) in addition to generating pulses for the desired rise time and the desired fall time, and the generated desired on-time pulse may also be independently adjusted (e.g., "tuned") in amplitude and/or width by the analog circuitry and/or digital components in multi-step pulse generation module 4. In another example, multi-step pulse generation module 4 may generate a warm-up pulse representing an initial pulse before the generated pulse of the desired rise time, and the generated desired warm-up pulse may also be independently adjusted (e.g., "tuned") in amplitude and/or width by the analog circuitry and/or digital components in multi-step pulse generation module 4. In some examples, multi-step pulse generation module 4 may further generate an on-surge pulse to drive a peak current through the PIN diodes to ensure that the PIN diodes are fully on, and the generated desired on-surge pulse may also be independently adjusted (e.g., "tuned") in amplitude and/or width by the analog circuitry and/or digital components in multi-step pulse generation module 4. In some examples, multi-step pulse generation module 4 may also generate an off-surge pulse to pull off as much charge from the PIN diodes as possible to assist in achieving the desired fall time, and the generated desired off-surge pulse may also be independently adjusted (e.g., "tuned") in amplitude and/or width by the analog circuitry and/or digital components in multi-step pulse generation module 4. In some examples, multi-step pulse generation module 4 may also generate a cool-down pulse to remove any remaining charge from the PIN diodes to ensure the diodes are completely off so that the PIN diodes are quickly put into their maximum isolation state. The generated desired cool-down pulse may also be independently adjusted (e.g., "tuned") in amplitude and/or width by the analog circuitry and/or digital components in multi-step pulse generation module 4. It is contemplated in this disclosure that any of the optional pulses may be comprised of a plurality of additional pulses.

As used in this disclosure, independently adjustable may mean there is a significantly reduced correlation between each of the plurality of pulses. In some examples, multi-step pulse generation module 4 may include discrete digital logic components that require an input to generate a plurality of pulses with minimal correlation between the plurality of pulses. In some examples, multi-step pulse generation module 4 may include an analog-to-digital converter that requires an input to generate a plurality of pulses with minimal correlation between the plurality of pulses. It is contemplated by this disclosure that independently adjustable does not mean completely independent, but instead functionally independent, such that independently adjusting one pulse may affect another pulse, but not to the degree that the function of the affected pulse is rendered dependent on the affecting pulse as discussed above.

Drive signal module 6 may include either analog circuitry and/or digital components that receive the plurality of pulses from multi-step generation module 4 and combine the plurality of pulses to generate a drive signal. In one example, as described below in FIGS. 2A-2B, multi-step pulse generation module 4 may include analog components, such as resistors, capacitors, and operational amplifiers. In some examples, drive signal module 6 may also generate an inverted drive signal. In some examples, drive signal module 6 provides an increase in current in order to meet the current requirements to drive RF interface 8. In some examples, the inverted drive signal may be shunt control to the PIN diodes in RF interface 8.

RF interface module 8 includes a plurality of PIN diodes (i.e., a PIN diode attenuator), along with analog components, such as capacitors, inductors, and resistors. RF interface module 8 may receive the drive signal and/or the inverted drive signal from drive signal module 6 to drive the PIN diodes "on" and "off" to generate a RF envelope with a desired rise time and a desired fall time. In some examples, the rise time of the RF envelope is the amount of time a PIN diode takes to go from "off" to "on." In other examples, the fall time of the RF envelope may be the amount of time a PIN diode takes to go from "on" to "off." In some examples, RF interface module 8 may be a non-reflective switch or attenuator, which may divert energy into a load (where it is dissipated mostly as heat) and does not present a high voltage standing wave ratio (VSWR), which may be harmful to components or radiate higher unwanted emissions. In some examples, RF interface module 8 may also include RF bypass and isolation circuit elements.

Input 10 of multi-step pulse generation module 4 may be a complementary metal oxide semiconductor (CMOS) input signal or transistor-transistor logic (TTL) input signal between 0-5V. In some examples, input 10 may be the trigger input to turn on the PIN diode(s).

Output 11 of RF interface module 8 may be a desired RF pulse (e.g., an RF envelope). In some examples, output 11 may be an RF pulse from PIN diode(s) turning on and off.

Figure 2A:
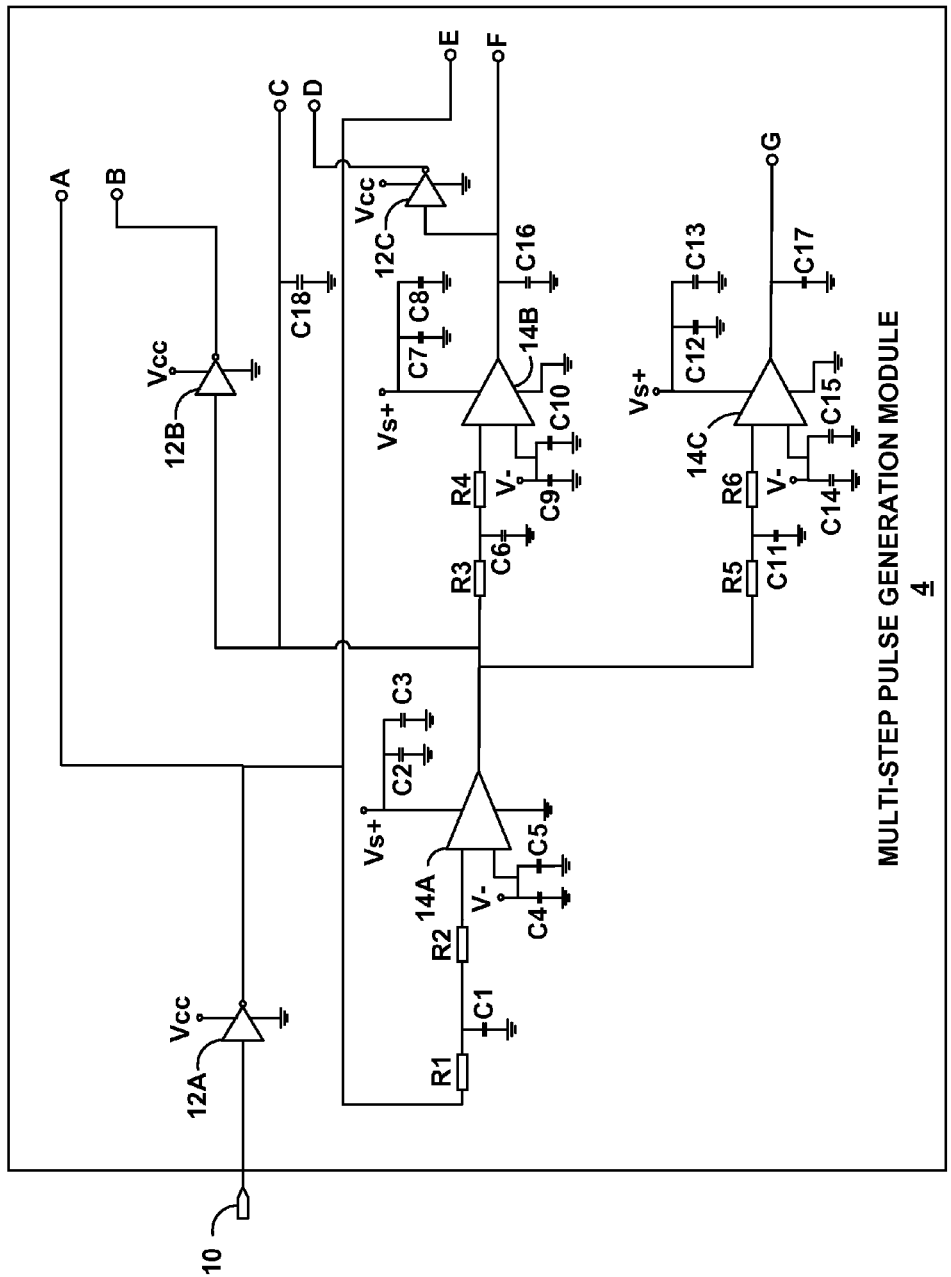
FIGS. 2A-2B are circuit diagrams illustrating an example of the multi-step pulse generation module.
Figure 2B:
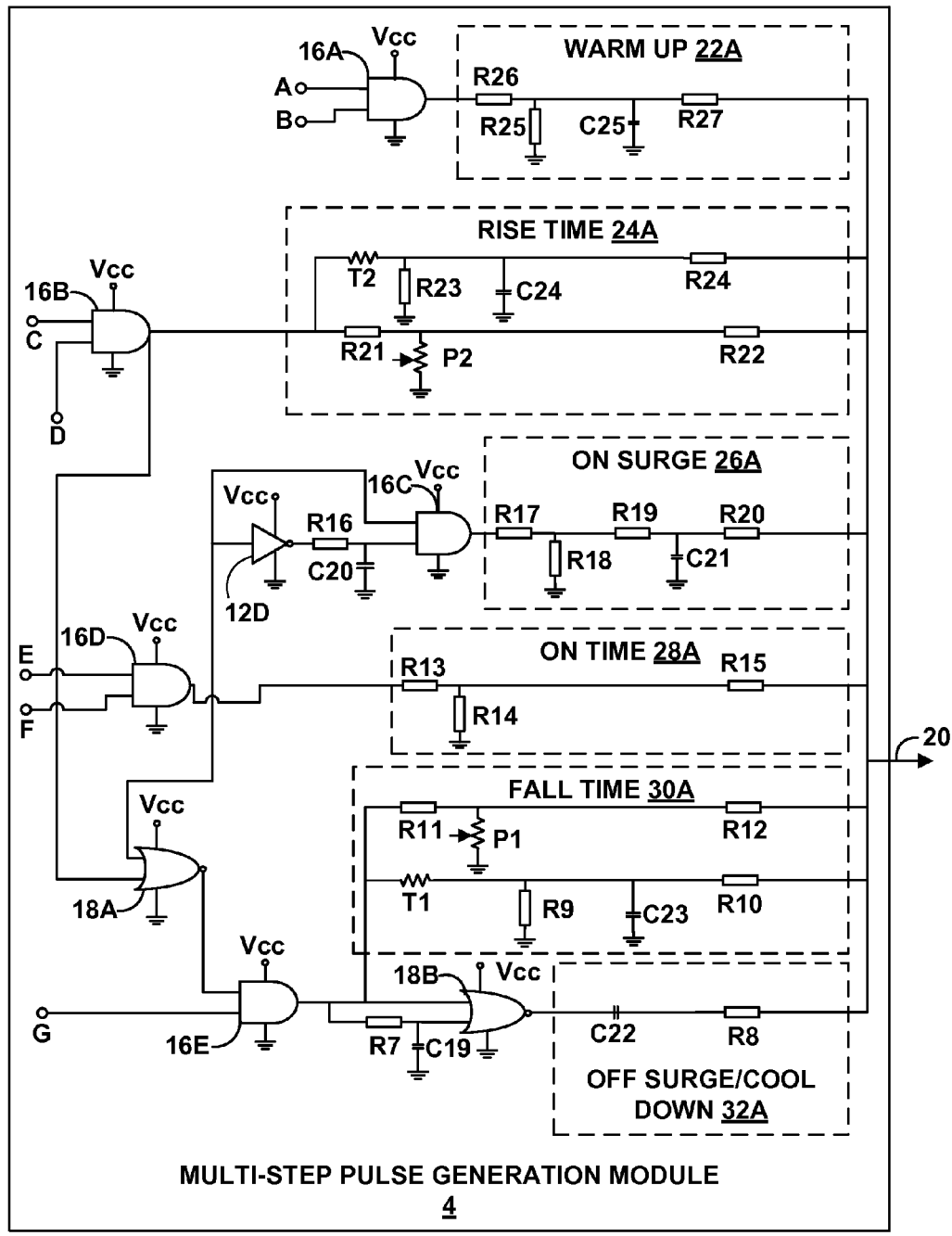

FIGS. 2A-2B are circuit diagrams illustrating an example of multi-step pulse generation module 4. FIG. 2A represents a first portion of the circuitry comprising multi-step pulse generation module 4, while FIG. 2B represents a second portion of the circuitry comprising multi-step pulse generation module 4. The circuitry shown in FIG. 2A connects to the circuitry shown in FIG. 2B at connection points A-G, with connection A of FIG. 2A connecting to connection A of FIG. 2B, connection B of FIG. 2A connecting to connection B of FIG. 2B, and so on. In the examples of FIGS. 2A-2B, the discrete digital logic components, such as inverters 12A-12D, AND gates 16-16E, and NOR gates 18A-18B are supplied by a positive power supply pin (e.g., $V_{cc}$), and connected to ground. In some examples, Vcc may be 5 volts (V), or any voltage that can be used by the discrete logic gates.

Multi-step pulse generation module 4 includes input 10 as described in FIG. 1, inverters 12A-12D, operational amplifiers 14A-14C, resistors R1-R27, potentiometers P1-P2, thermistors T1-T2, capacitors C1-C25, AND gates 16A-16E, and NOR gates 18A-18B.

Inverters 12A-12D, also known as NOT gates, are logic gates which implement logical negation and output a voltage representing the opposite logic-level to its input. For example, when one of inverters 12A-12D receives an input of logical 1 or "high" it produces an output of logical or 0 or "low," and when one of inverters 12A-12D receives an input of logical 0 or "low" it produces an output of logical 1 or "high." In some examples, inverters 12A-12D may be used to filter input 10 to provide either a "low" or a "high" state.

Operational amplifiers 14A-14C each have a V+ and a V− input, and ideally the operational amplifier (op-amp) amplifies only the difference in voltage between the two, which is called the differential input voltage. The operational amplifiers 14A-14C act as comparators (e.g., a voltage threshold detector) that detect when the input crosses the V-threshold before sending out a 5 volt (V) pulse. In the example of FIG. 2A, the V− is supplied with 2V and is connected to ground through capacitors C4 and C5, and Vs+ is supplied with 6V and is connected to ground through capacitors C2 and C3. In other implementations, other voltages for V− and V+ may be used. In the example of FIG. 2A, the V+ of operational amplifier 14A receives the output from NOT gate 12A through resistors R1 and R2 in series and capacitor C1 between resistors R1 and R2 and connected to ground, which act as a low pass filter to smooth-out the incoming logic pulse. By smoothing-out the incoming logic pulse, the comparator acts as a delay circuit since the threshold voltage needed to trigger the comparator circuit takes longer to occur. In the example of FIG. 2A, the V+ of operational amplifier 14B receives the output from operational amplifier 14A through resistors R3 and R4 in series and capacitor C6 between resistors R3 and R4 and connected to ground, which acts as a low pass filter to smooth-out the pulse arriving at the input of operational amplifier 14B so that the outgoing pulse from 14B will be delayed. In some examples, operational amplifiers 14A-14C may increase the amplitude of the high output as compared to the high input. In some examples, operational amplifiers 14A-14C may also shift (i.e., "delay") the pulse width of the high output as compared to the high input. In some examples, the shift of the high out enables multi-step pulse generation module 4 to use discrete logic components to generate a plurality of pulses of varying pulse sections.

Resistors R1-R33 may, for example, be passive two-terminal electrical components that implement electrical resistance as a circuit element. As resistors are specified and manufactured over a very large range of values, the derived units of milliohm (1 m$\Omega$=10$^{-3}$$\Omega$) and kilohm (1 k$\Omega$=10$^{3}$$\Omega$) are commonly used. In addition to resistors, thermistors T1-T2 may, for example, be a type of resistor whose resistance varies significantly with temperature compared to a standard resistor, such as resistors R1-R33. Thermistors may be used as the properties of a PIN diode change over temperature. In particular, the drive signal may need to be adjusted based on the temperature in order to maintain a consistent RF envelope. Thermistors T1-T2 may provide an indication of the properties of a PIN diode over temperature, which may be used to adjust the amplitude of the rise and fall pulses over temperature.

Potentiometers P1-P2 may, for example, be a passive analog three-terminal resistor with a sliding contact that forms an adjustable voltage divider. In some examples, potentiometers P1-P2 may be a digital potentiometer that is an electronic component that mimics the functions of analog potentiometers, such as adjusting the resistance between two terminals through a digital input. As will be explained in greater detail below, the rise time and fall time of the RF envelope generated by one or more PIN diodes of an RF interface, such as RF interface 8, may be independently adjusted by varying the resistances of P1 and/or P2. In some examples, the rise time of the RF envelope may be the amount of time a PIN diode takes to go from "off" to "on." In other examples, the fall time of the RF envelope may be the amount of time a PIN diode takes to go from "on" to "off."

Capacitors C1-C25 may, for example, be passive two-terminal electrical components used to store energy electrostatically in an electric field. For example, one common construction consists of metal foils separated by a thin layer of insulating film. Tables 1-4 show one set of example values for the various components illustrated in FIGS. 2A and 2B. In general, the capacitors are used to filter high frequency RF signals. In some examples, the RF signal may be around 1 gigahertz (GHz). It is contemplated that other various components with other values may be used in a similar manner to achieve a similar effect as the example described in FIGS. 2A and 2B.

TABLE 1

Values of the Resistors in FIGS. 2A & 2B

| Resistor | Ohms ($\Omega$) |
|---|---|
| R1 | 3.09k |
| R2 | 10k |
| R3 | 6.98k |
| R4 | 10k |
| R5 | 15.3k |
| R6 | 10k |
| R7 | 20k |
| R8 | 5.49k |
| R9 | 10k |
| R10 | 5.49k |
| R11 | 4.02k |
| R12 | 5.49k |

TABLE 1-continued

Values of the Resistors in FIGS. 2A & 2B

| Resistor | Ohms ($\Omega$) |
|---|---|
| R13 | 4.02k |
| R14 | 10k |
| R15 | 5.49k |
| R16 | 7.68k |
| R17 | 475 |
| R18 | 1k |
| R19 | 4.64k |
| R20 | 5.49k |
| R21 | 10k |
| R22 | 3.09k |
| R23 | 1k |
| R24 | 3.09k |
| R25 | 30.1k |
| R26 | 7.87k |
| R27 | 20k |

TABLE 2

Values of the Capacitors in FIGS. 2A & 2B

| Capacitor | Farads (F) |
|---|---|
| C1 | 22p |
| C2 | 22p |
| C3 | 1µ |
| C4 | 22p |
| C5 | 1µ |
| C6 | 22p |
| C7 | 22p |
| C8 | 1µ |
| C9 | 22p |
| C10 | 1µ |
| C11 | 22p |
| C12 | 22p |
| C13 | 1µ |
| C14 | 22p |
| C15 | 1µ |
| C16 | 10p |
| C17 | 10p |
| C18 | 10p |
| C19 | 22p |
| C20 | 22p |
| C21 | 22p |
| C22 | 22p |
| C23 | 22p |
| C24 | 22p |
| C25 | 22p |

TABLE 3

Values of the Thermistors in FIGS. 2A & 2B

| Thermistor | Ohms ($\Omega$) |
|---|---|
| T1 | 14k |
| T2 | 10k |

TABLE 4

Values of the Potentiometers in FIGS. 2A & 2B

| Potentiometer | Ohms ($\Omega$) |
|---|---|
| P1 | 5k |
| P2 | 5k |

AND gates 16A-16E are basic digital logic gates that implements logical conjunction, such that a HIGH output (1)

results only if both the inputs to the AND gate are HIGH (1). If neither or only one input to the AND gate is HIGH, a LOW output results. In another sense, the function of AND effectively finds the minimum between two binary digits. Therefore, the output is always 0 except when all the inputs are 1s.

NOR gates 18A-18B are digital logic gates that implements logical NOR, such that a HIGH output (1) results if both the inputs to the gate are LOW (0). If one or both inputs of the NOR gate is HIGH (1), a LOW output (0) results. NOR is the result of the negation of the OR operator. The NOR gate can also be seen as an AND gate with all the inputs inverted.

Between the examples of FIGS. 2A and 2B, there are seven connections A-G, which represent points where first portion of multi-step generation module 4 in FIG. 2A connects to the second portion of multi-step generation module 4 in FIG. 2B. As discussed above, FIGS. 2A and 2B represent two different portions of multi-step generation module 4. Multi-step pulse generation module 4 is divided across two separate figures due to the number of components shown. Connections A-G are meant to show how the two portions connect and do not represent actual circuit components.

In the example of FIG. 2B, warm-up circuitry 22A may receive the output from AND gate 16A with inputs from connections A-B. AND gate 16A multiples the high and low signals from connections A-B. In the example of FIG. 2A, connection A is the high-low output signal from inverter 12A, which is the inversion of input 10. In the example of FIG. 2A, connection B is the high-low output signal from inverter 12A through operational amplifier 14A, and through inverter 12B. In some examples, the high-low output signal of connection B may be shifted by operational amplifier 14A. In some examples, the amount of shift by operational amplifier 14A may be the pulse width of the warm up pulse from warm-up circuitry 22A, after multiplication by AND gate 16A.

In the example of FIG. 2B, rise time circuitry 24A may receive the output from AND gate 16B with inputs from connections C-D. AND gate 16B multiplies the high and low signals from connections C-D. In the example of FIG. 2A, connection C is the high-low output signal from inverter 12A through operational amplifier 14A. In some examples, the high-low output signal of connection C may be shifted by operational amplifier 14A. In the example of FIG. 2A, connection D is the high-low output signal from inverter 12A through operational amplifiers 14A, 14B, and through inverter 12C. In some examples, the high-low output signal of connection D may be shifted by operational amplifiers 14A, 14B. In some examples, the amount of shift by operational amplifiers 14A, 14B is the pulse width of the rise time pulse from rise time circuitry 24A after multiplication by AND gate 16B. In some examples, the amplitude of the high-low output signal from AND gate 16B may be increased by potentiometer P2.

In the example of FIG. 2B, on surge circuitry 26A may receive the output from AND gate 16C, inverter 12D, and AND gate 16D with inputs from connections E-F. In the example of FIG. 2A, connection E is the high-low output signal from inverter 12A, which is the inversion of input 10. In the example of FIG. 2A, connection F is the high-low output signal from inverter 12A through operational amplifiers 14A, 14B. In some examples, the high-low output signal of connection F may be shifted by operational amplifiers 14A, 14B. In some examples, AND gate 16C multiplies the high-low output signals from inverter 12D and AND gate 16D. Inverter 12D inverts the output signal from AND gate 16D. AND gate 16D multiplies the high-low signals from connections E, F.

In the example of FIG. 2B, on time circuitry 28A may receive the output from AND gate 16D with inputs from connections E-F, as described above. In some examples, the high-low output signal of connection F may be shifted by operational amplifiers 14A, 14B. In some examples, the amount of shift by operational amplifiers 14A, 14B may be the pulse width of the on time pulse from on time circuitry 28A after multiplication by AND gate 16D.

In example of FIG. 2B, fall time circuitry 30A may receive the output from AND gate 16E with inputs from connection G and NOR gate 18A, which receives its input from AND gates 16B, 16D. AND gate 16E multiplies the high and low signals from connection G and NOR gate 18A. In the example of FIG. 2A, connection G is the high-low output signal from inverter 12A through operational amplifier 14A, and through operational amplifier 14C. In the example of FIG. 2A, the high-low output signal of connection G may be shifted by operational amplifiers 14A, 14C. In the example of FIG. 2A, the high-low output signal from NOR gate 18A is the inverse addition of the high-low output signals of AND gates 16B, 16D. AND gate 16B multiplies the high-low signals of connections C, D as described above. AND gate 16C multiplies the high-low signals of connections E, F as described above. In some examples, the amount of shift by operational amplifiers 14A, 14B, 14C may be the pulse width of the fall time pulse from fall time circuitry 30A after multiplication by AND gate 16E. In some examples, the amplitude of the high-low output signal from AND gate 16E may be increased by potentiometer P1.

In the example of FIG. 2B, off-surge/cool-down circuitry 32A may receive the output from NOR gate 18B, and AND gate 16E with inputs from connection G and NOR gate 18A with inputs from AND gates 16B, and 16D, as described above. AND gate 16E multiplies the high and low signals from connection G and NOR gate 18A. In the example of FIG. 2A, connection G is the high-low output signal from inverter 12A through operational amplifier 14A, and through operational amplifier 14C. In the example of FIG. 2A, the high-low output signal of connection G may be shifted by operational amplifiers 14A, 14C. In the example of FIG. 2A, the high-low output signal from NOR gate 18A is the inverse addition of the high-low output signals of AND gates 16B, 16D. AND gate 16B multiplies the high-low signals of connections C, D as described above. AND gate 16C multiplies the high-low signals of connections E, F as described above. In some examples, the amount of shift by operational amplifiers 14A, 14B, 14C may be the pulse width of the off-surge/cool-down pulse from off-surge/cool-down circuitry 32A after the inverse addition by NOR gate 18B of the high-low output signal of AND gate 16E.

In one example of FIG. 2B, the plurality of pulses from rise time circuitry 24A and fall time circuitry 30A may output to drive signal module 6 as output 20. In some examples of FIG. 2B, the plurality of pulses from optional circuitry, such as warm up circuitry 22A, on-surge circuitry 26A, on-time circuitry 28A, and off-surge/cool-down circuitry 32A may also output to drive signal module 6 as output 20. It is contemplated by this disclosure that the discrete logic components manipulate (i.e., "superposition") the input 10 to generate the plurality of pulses in output 20. It is also contemplated by this disclosure that the manipulation (i.e., "superposition") by the discrete logic may be replaced by a digital-to-analog converter or a programmable logic device.

Figure 3:
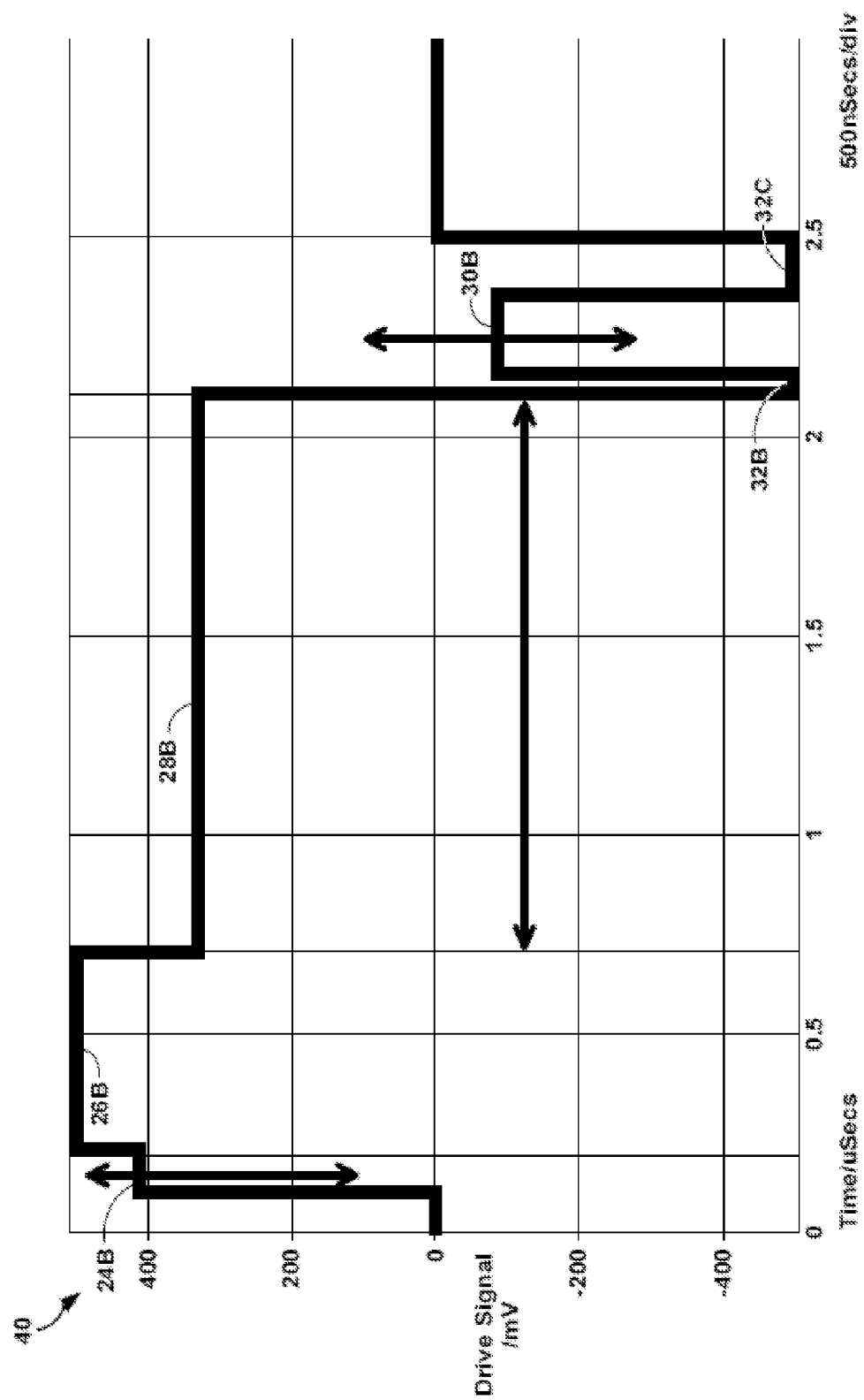
FIG. 3 is a conceptual diagram illustrating an example of an ideal drive signal including superposition of pulses that set the current across the diode(s) to control how quickly the charge carriers move to and from the P and N semiconductor regions.

FIG. 3 is a conceptual diagram illustrating an example of ideal drive signal 40 including superposition of pulses that set the current across the diode(s) to control how quickly the charge carriers move to and from the P and N semiconductor regions. In the example of FIG. 3, combined ideal drive signal 40 provides precise control of the RF envelope, such as rise time pulse 24B, on surge pulse 26B, on pulse 28B, fall time pulse 30B, off-surge pulse 32B, and cool-down pulse 32C while not changing the on-off isolation. In the example of FIG. 3, each pulse of this disclosure may be a single pulse. It is also contemplated as part of this disclosure that each pulse may comprise a combination of pulses. Additionally, it is also contemplated as part of this disclosure that "high" pulses move charge carriers from the P and N semiconductor regions to the intrinsic region, and "low" pulses move charge carriers from the intrinsic region back to the P and N semiconductor regions.

In one example of FIG. 3, ideal drive signal 40 may be a combination of two pulses. A first pulse, such as rise time pulse 24B, which may be independently adjustable, either by a user or by automated means for example, with control circuitry, such as the corresponding rise time circuitry 24A as described in FIGS. 1-2B, and sets the rise time of the RF envelope. A second pulse, such as the fall-time pulse 32B, which may be independently adjustable, either by a user or by automated means for example, with control circuitry, such as the corresponding fall time circuitry 30A as described in FIGS. 1-2B, and sets the fall time of the RF envelope.

In some examples, ideal drive signal 40 may have an optional third pulse, such as on pulse 28B, may be independently adjustable, either by a user or by automated means for example, with control circuitry. For example, operational amplifiers delaying one or more pulses and discrete logic manipulates the one or more pulses to be a specific pulse width, such as the corresponding on time circuitry 28A as described in FIGS. 1-2B, and sets the pulse width of the RF envelope. In some examples, ideal drive signal may have an optional fourth pulse, such as on surge pulse 26B, which may be independently adjustable, either by a user or by automated means for example, with control circuitry, such as the corresponding on surge circuitry 26A as described in FIGS. 1-2B, and drives a peak current through the PIN diodes to ensure that the PIN diodes are fully on. In some examples, ideal drive signal 40 may have an optional fifth pulse, such as off surge pulse 32A, which may be independently adjustable, either by a user or by automated means for example, with control circuitry, such as the corresponding off surge/cool down circuitry 32A as described in FIGS. 1-2B, and has a short duration that drops rapidly by pulling off some of the stored charge so that shorter pulse widths of the RF envelope can be realized. In some examples, ideal drive signal 40 may have an optional sixth pulse, such as cool-down pulse 32C, which may be independently adjustable, either by a user or by automated means for example, with control circuitry, such as the corresponding off surge/cool-down circuitry 32A, and pulls off any remaining charge from the intrinsic region to ensure that the PIN diodes are in a high-isolation state.

Rise time pulse 24B may be the first pulse in the drive signal sequence that drives the PIN diodes to turn on. In some examples, the amplitude and/or pulse width of this pulse may be independently adjustable, either by a user or by automated means for example, through a control circuit using either analog circuitry and/or digital components, such as potentiometer P1-P2 as described in FIGS. 2A-2B. The higher the amplitude of the rise time pulse 24B, the higher the initial current to the PIN diodes will be, the faster the holes and electrons are injected into the I-region, and the faster the diodes turn on, resulting in an increase of the rise time for the RF envelope.

On surge pulse 26B may come immediately after the rise time pulse 24B and have higher amplitude than the on pulse 28B, as described below. In some examples, on surge pulse 26B may be a "high" pulse, by applying additional charge to ensure the PIN diodes are turned on completely. In some examples, on surge pulse 26B may provide an extra boost of current to the PIN diodes to ensure that full recombination of the holes and electrons have occurred. In some examples, the pulse is optional, but eliminates a gradual rising edge on the RF envelope.

On pulse 28B may be independently adjustable, either by a user or by automated means for example, to be as narrow or as wide as required to achieve the desired pulse width of the RF envelope, such as RF envelope 62 as described in FIG. 4. In some examples, on pulse 28B may be optional. In some examples, on pulse 28B may be a "high" pulse, which ensures the PIN diodes are fully turned on for a specific pulse width and/or time. In some examples, the amplitude of on pulse 28B may also be designed to keep the diodes at a forward bias for a specific application, such as RF transmission for vehicle traffic collision systems.

Off surge pulse 32B may have a similar function to the on surge pulse 26B but conversely may be designed to pull off as much charge as possible to assist fall time pulse 30B, and improves the turn off time of the RF envelope. In some examples, off surge pulse 32B may be optional. In some examples, off surge pulse 32B may be a "low" pulse, by removing charge from the PIN diodes.

Fall time pulse 30B may set the rate at which holes and electrons leave the I-region of the PIN diode(s). In some examples, the amplitude and/or pulse width of fall time pulse 30B may be independently adjustable, either by a user or by automated means for example, through a control circuit using either analog circuitry and/or digital components, such as potentiometer P1-P2 as described in FIGS. 2A-2B. The lower the amplitude of the fall time pulse 30B, the faster the holes and electrons are removed from the I-region and the faster the diodes turn off, resulting in a faster fall time for the RF envelope. Thus, by increasing the resistance of potentiometer P1 may increase the amplitude of fall time pulse 82, which turns the PIN diode(s) off slower and increases the fall time of an RF envelope, such as RF envelope 62. In some examples, decreasing the resistance of potentiometer P1 may decrease the amplitude of fall time pulse 82, which turns the PIN diode(s) off faster and decreases the fall time of an RF envelope, such as RF envelope 62.

Cool-down pulse 32C may remove any remaining charge off of the I-region to ensure that the PIN diode is fully off. Although optional, cool-down pulse 32C may improve off isolation of the PIN diode(s) immediately after the pulse is complete. In some examples, cool-down pulse 32C may be optional. In some examples, cool-down pulse 32C may be a "low" pulse by removing any remaining charge to ensure the PIN diodes are fully turned off.

The entire composite pulse waveform 40 shown in FIG. 3 may be biased to a negative DC offset voltage to improve 'off' isolation of RF modulator 2, as described in FIG. 1. This negative offset should be more than the "punch-through" voltage of the diode(s) to ensure that diodes are in their optional isolation state.

FIG. 4 is a conceptual diagram illustrating an example of drive signal 66, inverted drive signal 68, RF envelope 62 and input 64. In the example of FIG. 4, drive signal 66 and inverted drive signal 68 are the outputs of drive signal module 6, described below in FIG. 6, including the combined plurality of pulses from the multi-step pulse generation module 4. In the example of FIG. 4, input 64 may be one input to RF modulator 2 and RF envelope 62 may be the output of RF modulator 2.

Drive signal 66 may be based on the combination of the plurality of pulses generated by multi-step pulse generation module 4 to provide series control to the PIN diode(s) of RF interface 8. In some examples, drive signal 66 may be based on a combination of the outputs including rise time circuitry 24A and fall time circuitry 30A. In some examples, drive signal 66 may also be based on a combination of the outputs including on-time circuitry 28A. In some examples, drive signal 66 may also be based on a combination of outputs including warm-up circuitry 22A. In some examples, drive signal 66 may also be based on a combination of outputs including on-surge circuitry 26A. In some examples, drive signal 66 may also be based on a combination of outputs including off-surge/cool-down circuitry 32A. Inverted drive signal 68 is an inversion of drive signal 66 and provides shunt control to the PIN diode(s) of RF interface 8. RF envelope 62 represents the RF envelope generated by the PIN diodes (not shown), which may correspond to the RF envelope at output 11 as described in FIG. 1. In some examples, RF envelope 62 represents the RF envelope generated because of drive signal 66 and inverted drive signal 68. Input 64 represents the input voltage provided to RF modulator 2 and received by multi-step pulse generation module 4.

Figure 5F:
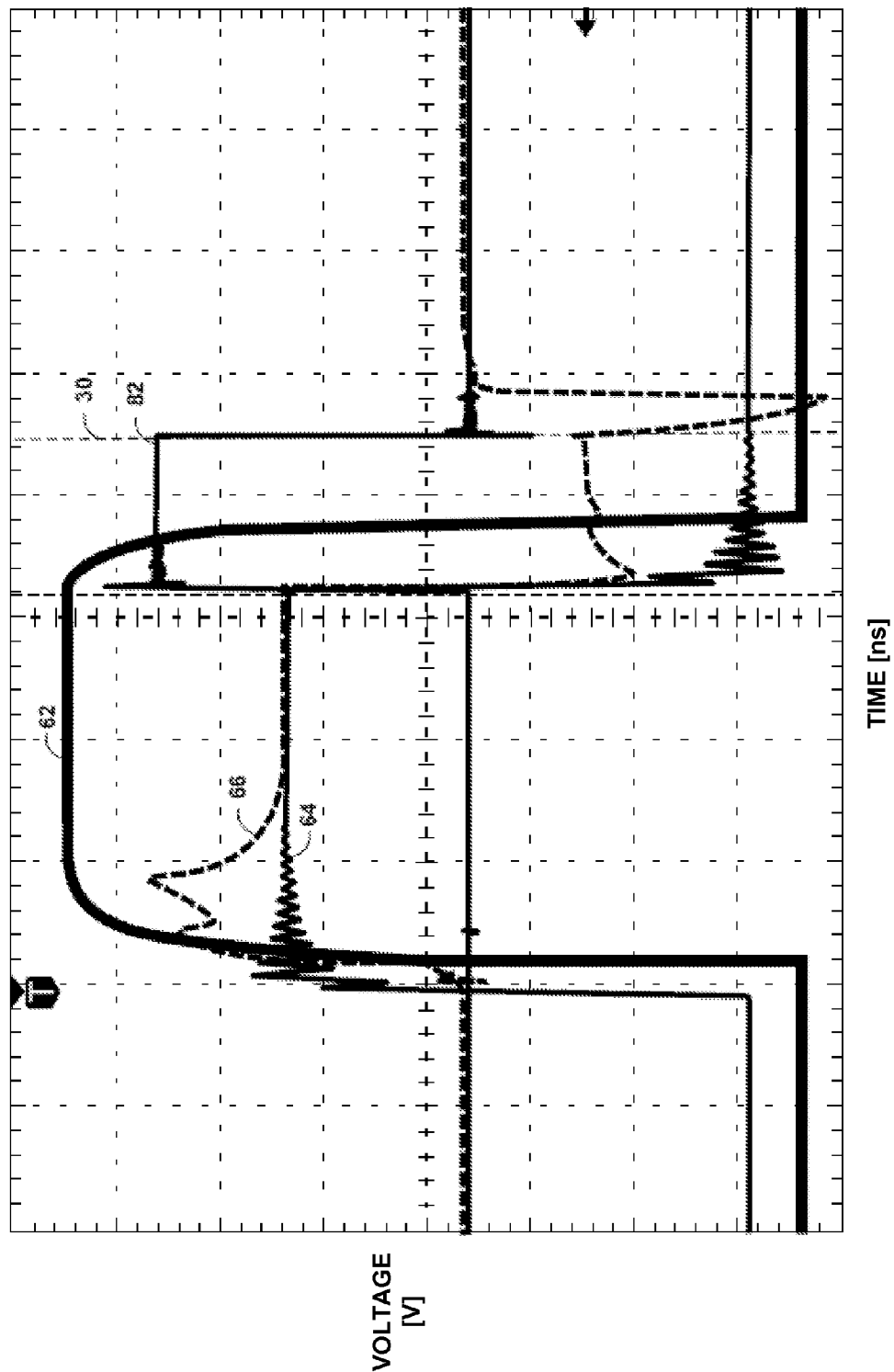

FIGS. 5A-5G are conceptual diagrams illustrating example pulses from the plurality of pulses generated by multi-step pulse generation module 4. Each figure in FIGS. 5A-5G includes drive signal 66, RF envelope 62, and input 64 as described in FIG. 4, to provide context to each pulse from the plurality of pulses in FIGS. 5A-5G. Further, FIGS. 5A-5G each include a respective section of drive signal 66. Sections 22-32 are provided to illustrate each respective section in drive signal 66, which is a signal composed of a combination of outputs 72-82 generated by circuitries 22A-32A as described FIG. 2B. In some examples, sections 22-32 may be composed of a respective output from outputs 72-82. In some examples, sections 22-32 may be composed of one or more outputs (i.e., the outputs from circuitries 22A-32A may overlap in a particular section) from outputs 72-82. For example, section 30 of drive signal 66 in FIG. 5F is composed of a combination of more than one output from circuitries 22A-32A. In the example of FIG. 5F, section 30 may be composed of a combination of the outputs from circuitry 30A (e.g., output 82) and circuitry 32A (e.g., a portion of output 80 as shown in FIGS. 5E and 5G). In other words, section 30 may be composed of a combination of overlapping outputs, such as output 82 of circuitry 30A, and portions of output 80 (e.g., 80A and 80B) of circuitry 32A with respect to section 32 as described in FIGS. 5E and 5G.

In the example of FIG. 5A, warm-up pulse 72 may represent the warm-up pulse as described in FIG. 1, and may be a fixed pulse width. Warm-up pulse 72 is generated by warm-up circuitry 22A of multi-step pulse generation module 4 as described in FIGS. 2A-2B. In some examples, the pulse width and/or amplitude of warm up pulse 72 may be independently adjustable, either by a user or by automated means for example, by adjusting rise time circuitry 24A. In some examples, warm up pulse 72 may be a "high pulse."

In the example of FIG. 5B, rise time pulse 74 may correspond to the rise time pulse, such as rise time pulse 24B (i.e., "rise time") as described in FIGS. 1 and 3, and may be a fixed pulse width. Rise time pulse 74 is generated by rise time circuitry 24A of multi-step pulse generation module 4 as described in FIGS. 2A-2B. In the example of FIG. 5A, the amplitude of rise time pulse 74 may be independently adjustable (i.e., "tunable"), either by a user or by automated means for example, by adjusting potentiometer P2 of rise time circuitry 24A of multi-step pulse generation module 4 as described in FIGS. 2A-2B. In some examples, increasing the resistance of potentiometer P2 may increase the amplitude of rise time pulse 24B, which turns the PIN diode(s) on faster and decreases the rise time of an RF envelope, such as RF envelope 62. In some examples, decreasing the resistance of potentiometer P2 may decrease the amplitude of rise time pulse 24B, which turns the PIN diode(s) on slower and increases the rise time of an RF envelope, such as RF envelope 62. In some examples, the pulse width and/or amplitude of rise time pulse 74 may be independently adjustable (i.e., "tunable"), either by a user or by automated means for example, by adjusting rise time circuitry 24A.

In the example of FIG. 5C, on-surge pulse 76 may correspond to the on-surge pulse, such as on surge pulse 26B (i.e., "on-isolation") as described in FIGS. 1 and 3, and may be a fixed pulse width. On-surge pulse 76 is generated by on-surge circuitry 26A of multi-step pulse generation module 4 as described in FIGS. 2A-2B. In some examples, the on-surge pulse 76 ensures that all the holes and electrons have combined. In some examples, the amplitude of on-surge pulse 76 may be independently adjustable (i.e., "tunable"), either by a user or by automated means for example, by adjusting on-surge circuitry 26A. In some examples, the pulse width and/or amplitude of on-surge pulse 76 may be independently adjustable (i.e., "tunable"), either by a user or by automated means for example, by adjusting on-surge circuitry 26A. In some examples, on-surge pulse 76 may be a "high" pulse.

In the example of FIG. 5D, on pulse 78 may correspond to the on pulse, such as on pulse 28B (i.e., "pulse width") as described in FIGS. 1 and 3. On pulse 78 is generated by on-time circuitry 28A of multi-step pulse generation module 4 as described in FIGS. 2A-2B. In the example of FIG. 5D, the pulse width of on-surge pulse 76 may be adjusted to be as long as necessary, such as equal to or between 200 ns and 2 milliseconds (ms), depending on the desired on-time of the PIN diode(s). In some examples, the amplitude of on pulse 78 may be independently adjustable (i.e., "tunable"), either by a user or by automated means for example, by adjusting on-time circuitry 28A. In some examples, on pulse 78 may be a "high" pulse.

In the example of FIG. 5E, off-surge pulse 80A is a portion of off-surge/cool-down pulse 80 and may correspond to the off-surge pulse, such as off-surge pulse 32B (i.e., "off-isolation") as described in FIGS. 1 and 3, and may be a fixed pulse width. Off-surge pulse 80A is a portion of off-surge/cool-down pulse 80 generated by off-surge/cool-down circuitry 32A of multi-step pulse generation module 4 as described in FIGS. 2A-2B. In some examples, off-surge pulse 80A quickly removes some of the charge from the intrinsic region of the PIN diode(s). In some examples, the pulse width and/or amplitude of off-surge pulse 80A may be independently adjustable (i.e., "tunable"), either by a user or by automated means for example, by adjusting off-surge/cool-down circuitry 32A. In some examples, off-surge pulse 80A may be a "low" pulse.

In the example of FIG. 5F, fall time pulse 82 may correspond to the fall time pulse, such as fall time pulse 30B (i.e., "fall time") as described in FIGS. 1 and 3, and may be a fixed pulse width. Fall time pulse 82 is generated by fall time circuitry 30A of multi-step pulse generation module 4 as described in FIGS. 2A-2B. In the example of FIG. 5D, the amplitude of fall time pulse 82 may be independently adjustable (i.e., "tunable"), either by a user or by automated means for example, by adjusting potentiometer P1 of fall time circuitry 30A of multi-step pulse generation module 4 as described in FIGS. 2A-2B. In some examples, the pulse width of fall time pulse 82 may be independently adjustable, either by a user or by automated means for example, by adjusting fall time circuitry 30A. In some examples, increasing the resistance of potentiometer P1 may increase the amplitude of fall time pulse 82, which turns the PIN diode(s) off slower and increases the fall time of an RF envelope, such as RF envelope 62. In some examples, decreasing the resistance of potentiometer P1 may decrease the amplitude of fall time pulse 82, which turns the PIN diode(s) off faster and decreases the fall time of an RF envelope, such as RF envelope 62.

In the example of FIG. 5G, cool-down pulse 80B is a portion of off-surge/cool-down pulse 80 and may correspond to the cool-down pulse, such as cool-down pulse 32C (i.e., "off-isolation") as described in FIGS. 1 and 3, and may be a fixed pulse width. Cool-down pulse 80B is a portion of off-surge/cool-down pulse 80 generated by off-surge/cool-down circuitry 32A of multi-step pulse generation module 4 as described in FIGS. 2A-2B. In some examples, cool-down pulse 80B may remove any remaining charge from the intrinsic region of the PIN diode(s). In some examples, the pulse width and/or amplitude of cool-down pulse 80B may be independently adjustable, either by a user or by automated means for example, by adjusting off-surge/cool-down circuitry 32A. In some examples, cool-down pulse 80B may be a "low" pulse.

Figure 6:
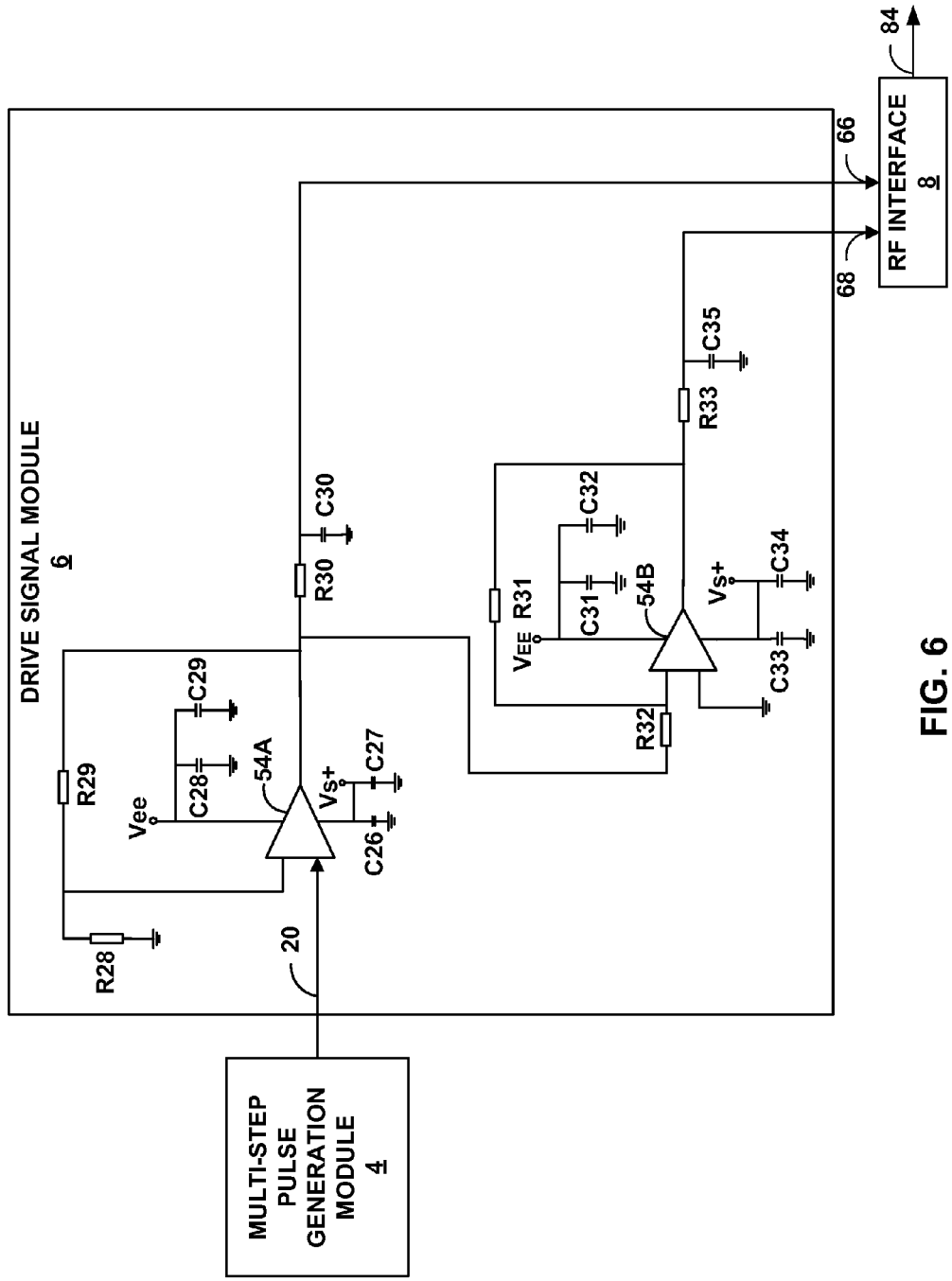
FIG. 6 is a circuit diagram illustrating an example of the drive signal module.

FIG. 6 is a circuit diagram illustrating an example of drive signal module 6. In the example of FIG. 6, drive signal module 6 receives output 20 from multi-step pulse generation module 4 including a plurality of pulses, combines the plurality of pulses to generate a drive signal. In some examples, drive signal module 6 amplifies the drive signal by increasing the current, such that the drive signal can drive the PIN diodes. In some examples, drive signal module 6 filters the drive signal with one or more low-pass filters to prevent sharp spikes in voltage and provide a more gradual change in voltage. In the example of FIG. 6, output 20 from multi-step pulse generation module 4 includes the plurality of pulses and is delivered to summing operational amplifiers 54A of drive signal module 6 to combine the plurality of pulses and increase the current in order to drive the PIN diode(s) in RF interface 8 as described with respect to FIG. 1.

Summing operational amplifiers 54A-54B may be used to combine several weighted voltages. Each may have a V+ and a V− input, and in one example, where the resistance is the same for each voltage, the summing operational amplifier outputs an inverse sum of the voltages.

In one example of FIG. 6, the V+ is supplied with output 20 from multi-step pulse generation module 4, and Vs+ is supplied with 6V and is connected to ground through capacitors C26, C27. In the example of FIG. 6, the V− of summing operational amplifier 54A is connected between R28 and R29, where R28 is connected to ground and R29 is connected to the output of summing operational amplifier 54A. In the example of FIG. 6, Vs− of summing operational amplifier 54A is supplied by a negative power supply pin (i.e., $V_{EE}$) and is connected to ground by capacitors C28, C29.

In example of FIG. 6, V− of summing operational amplifier 54B receives the output from summing operational amplifier 54A through resistor R32 and is connected to resistor R31, which is connected to the output of summing operational amplifier 54B. In the example of FIG. 6, the V+ of summing operational amplifier 54B is connected to ground to make summing operational amplifier 54B an inverting summing operational amplifier. In the example of FIG. 6, Vs− of summing operational amplifier 54A is supplied by a negative power supply pin (i.e., $V_{EE}$) and is connected to ground by capacitors C31, C32. In the example of FIG. 6, Vs+ of summing operational amplifier 54B is supplied by 6V and is connected to ground by capacitors C33, C34. In some examples, summing operational amplifiers 54A-54B may increase the current (i.e., "buffer" the drive signal) of drive signal 66 out as compared to output 20.

In the example of FIG. 6, operational amplifier 54A may be a non-inverting summing operational amplifier combining the plurality of pulses to generate drive signal 66 and provide series control to RF interface 8, as described in FIGS. 1 and 4. In the example of FIG. 6, operational amplifier 54B may be an inverting summing operational amplifier combining the plurality of pulses to generate inverted drive signal 68 and provide shunt control to RF interface 8, as described in FIGS. 1 and 4. In some examples, R30 and C30 and/or R33 and C35 may be low pass filters to prevent high frequency noise from being delivered to RF interface 8.

TABLE 5

| Values of the Resistors in FIG. 6 | |
|---|---|
| Resistor | Ohms (Ω) |
| R28 | 1.05k |
| R29 | 3.09k |
| R30 | 36.5 |
| R31 | 1k |
| R32 | 1k |
| R33 | 24.3 |

TABLE 6

| Values of the Capacitors in FIG. 6 | |
|---|---|
| Capacitor | Farads (F) |
| C26 | 22p |
| C27 | 1μ |
| C28 | 22p |
| C29 | 1μ |
| C30 | 22p |
| C31 | 22p |
| C32 | 1μ |
| C33 | 22p |
| C34 | 1μ |
| C35 | 22p |

In one example, summing operational amplifier 54A combines output 20 including the plurality of pulses received from the multi-step pulse generation module 4 to generate a drive signal, such as drive signal 66 as described in FIGS. 4-5G. In another example, summing operational amplifier 54A may also increase the current levels of output 20 to drive the PIN diode(s) of RF interface 8, as described in FIG. 1. In some examples, a second operational amplifier, such as inverted summing operational amplifier 54B receives the generated drive signal from operational amplifier 54A of drive signal module 6 and inverts drive signal 66 to generate an inverted drive signal, such as inverted drive signal 68 as described in FIGS. 4-5G. In some examples, drive signal 66 of drive signal module 6 is delivered to RF interface 8, as described in FIG. 1. In some examples, inverted drive signal 68 of drive signal module 6 is delivered to RF interface 8, as described in FIG. 1. In some examples, drive signal module 6 may also include an optional low-pass filter to remove high frequency noise from output 20. In some examples, RF interface 8 may receive drive signal 66 and inverted drive signal 68 and generate an RF envelope (e.g., RF envelope 62 as described in FIG. 4) at output 84, which may correspond to output 11 as described in FIG. 1.

FIG. 7 is a chart illustrating an example of specifications 90 for RF envelope 62 of RF modulator 2. In the example of FIG. 7, rise time 92 corresponding to rise time pulse 24B, 74 as described in FIGS. 3 and 5B of an RF output, such as RF envelope 62 as described in FIG. 4 may be between 50 and 100 nanoseconds (ns). In the example of FIG. 7, fall time 94 corresponding to fall time pulse 30B, 82 as described in FIGS. 3 and 5F of an RF output, such as RF envelope 62 may be between 50 ns and 200 ns. In the example of FIG. 7, pulse width 96 (i.e., on pulse) corresponding to on pulse 28B, 78 as described in FIGS. 3 and 5D of an RF output, such as RF envelope 62 may be between 700 ns and 900 ns. In some examples, pulse delay 98 between input 10 as described in FIG. 1 and an RF output, such as RF envelope 62 as described in FIG. 4, may be 150 ns or less. In some examples, max droop 100 of an RF output, such as RF envelope 62 may be plus or minus 0.5 decibels (dB). In some examples, max pulse width 102 corresponding to on pulse 28B, 78 as described in FIGS. 3 and 5D of an RF output, such as RF envelope 62 may be 30 microseconds (µs). In some examples, the minimum pulse width 104 corresponding to on pulse 28B, 78 as described in FIGS. 3 and 5D of an RF output, such as RF envelope 62 as described in FIG. 4 may be 0.45 µs. In some examples, temperature range 106 of RF modulator 2 as described in FIG. 1 is between minus 55 degrees Celsius and 85 degrees Celsius. In some examples, frequency range 108 of an RF output, such as RF envelope 62 as described in FIG. 4 may be between 1030 and 1090 megahertz (MHz). In some examples, the drive signal of the disclosure may have a very high isolation, such as 75 decibels (dB).

Figure 8:
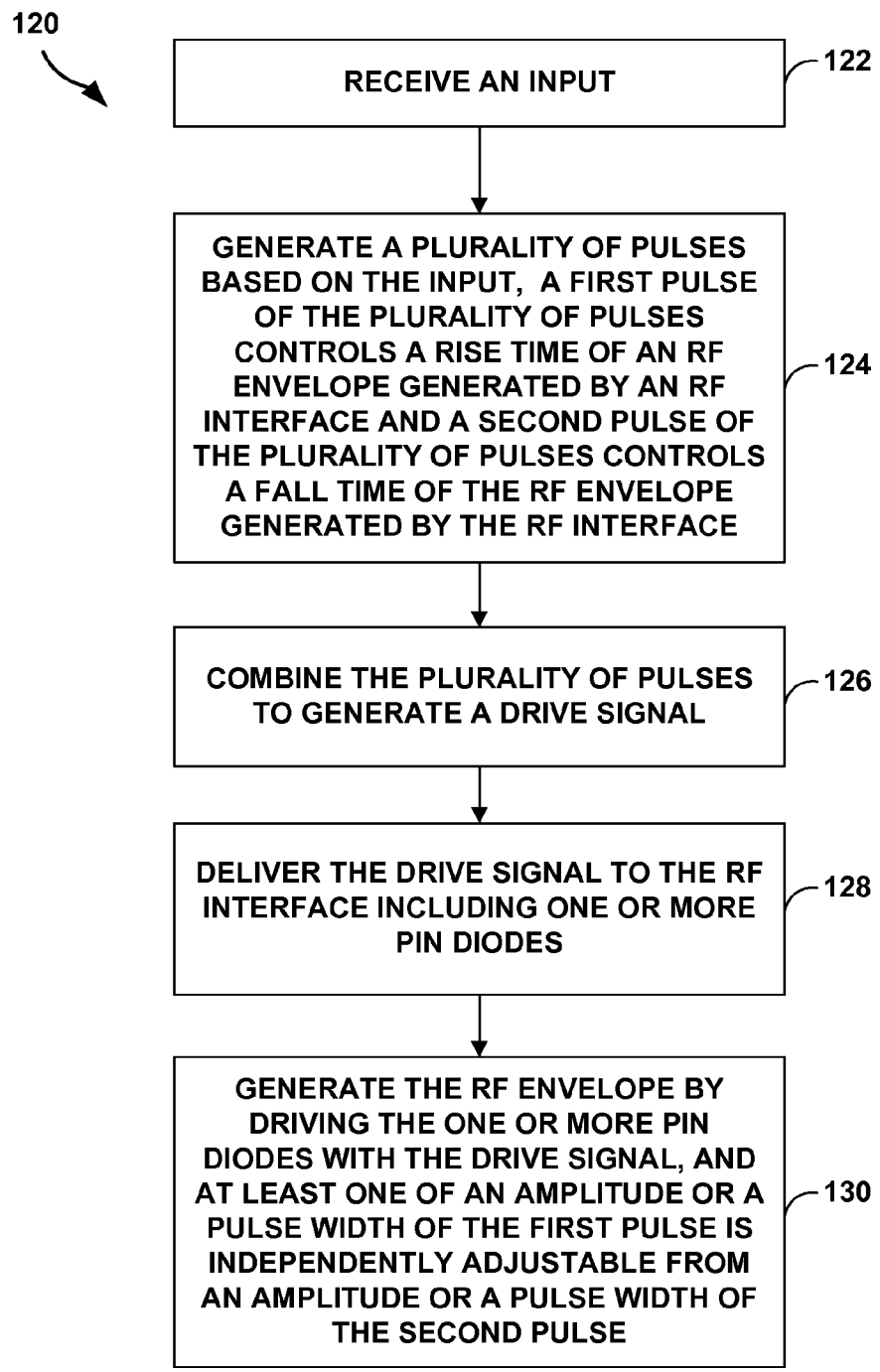
FIG. 8 is a flow chart illustrating an example process of generating a drive signal to drive the PIN diodes to generate an RF envelope.

FIG. 8 is a flow chart illustrating an example process 120 of generating a drive signal to drive the PIN diodes to generate an RF envelope. FIG. 8 is described within the context of FIGS. 1-3. In the example of FIG. 8, multi-step pulse generation module 4 of RF modulator 2 may receive input 10 (122), generate plurality of pulses 24-32 based on input 10, where first pulse 24B of the plurality of pulses controls a rise time of an RF envelope generated by RF interface 8 and second pulse 30B of the plurality of pulses controls a fall time of an RF envelope generated by RF interface 8 (124). In the example of FIG. 8, drive signal module 8 of RF modulator 2 may combine plurality of pulses 24-32 to generate drive signal 40(126), and deliver drive signal 40 to RF interface 8 including one or more PIN diodes (128). In the example of FIG. 8, RF interface 8 of RF modulator 2 may generate a RF envelope by driving the one or more PIN diodes with the drive signal, and at least one of amplitude or a pulse width of first pulse 24B is independently adjustable from amplitude or a pulse width of second pulse 30B.

In some examples, the plurality of pulses may include a third pulse to control a pulse width of the RF envelope generated by the one or more PIN diodes, and wherein at least one of an amplitude or a pulse width of the fourth pulse is independently tunable. In some examples, the third pulse may control the pulse width of the RF envelope to be between 700-900 nanoseconds (ns). In some examples, the amplitude of the plurality of pulses may be adjusted by one or more potentiometers, and the pulse width of the plurality of pulses may be adjusted by one or more operational amplifiers. In some examples, the plurality of pulses may further include one or more high pulses to control an on isolation of the one or more PIN diodes, and at least one of amplitude or a pulse width of the one or more high pulses are independently tunable. In some examples, the plurality of pulses may further include one or more low pulses to control an off isolation of the one or more PIN diodes, and at least one of amplitude or a pulse width of the one or more low pulses are independently tunable. In some examples, generating the plurality of pulses may include generating the plurality of pulses by an analog-to-digital converter. In some examples, the first pulse may control the rise time of the RF envelope to be between 50-100 nanoseconds (ns). In some examples, the second pulse may control the fall time of the RF envelope to be between 50-200 nanoseconds (ns). In some examples, the frequency of the RF envelope may be between 1030-1090 megahertz (MHz). In some examples, the pulse delay between the input and generation of the RF envelope by the RF interface may be 150 nanoseconds (ns) or less.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. A method of driving one or more P-Intrinsic-N (PIN) diodes, the method comprising:
   receiving an input;
   generating a plurality of pulses based on the input, wherein:
      a first pulse of the plurality of pulses controls a rise time of an RF envelope generated by an RF interface,
      a second pulse of the plurality of pulses controls a fall time of the RF envelope generated by the RF interface, and
      a third pulse of the plurality of pulses controls a pulse width of the RF envelope;
   combining the plurality of pulses to generate a drive signal, wherein at least one of an amplitude or a pulse width of the third pulse is independently tunable;
   delivering the drive signal to the RF interface including the one or more PIN diodes; and
   generating the RF envelope by driving the one or more PIN diodes with the drive signal,
   wherein at least one of an amplitude or a pulse width of the first pulse is independently tunable from an amplitude or a pulse width of the second pulse.

2. The method of claim 1, wherein the plurality of pulses further includes one or more high pulses to control an on isolation of the one or more PIN diodes, and wherein at least one of an amplitude or a pulse width of the one or more high pulses are independently tunable.

3. The method of claim 1, wherein the plurality of pulses further includes one or more low pulses to control an off isolation of the one or more PIN diodes, and wherein at least one of an amplitude or a pulse width of the one or more low pulses are independently tunable.

4. The method of claim 1, wherein generating the plurality of pulses comprises generating the plurality of pulses by a digital-to-analog converter.

5. The method of claim 1, wherein the amplitude of the plurality of pulses is adjusted by one or more potentiometers, and wherein the pulse width of the plurality of pulses is adjusted by one or more operational amplifiers.

6. The method of claim 1, wherein a frequency of the RF envelope is between 1030-1090 megahertz (MHz).

7. A radio frequency (RF) modulator device for driving one or more P-Intrinsic-N (PIN) diodes to generate an RF envelope, the RF modulator device comprising:
   first circuitry configured to receive an input and generate a plurality of pulses based on the input, wherein:
      a first pulse of the plurality of pulses controls a rise time of the RF envelope,
      a second pulse of the plurality of pulses controls a fall time of the RF envelope, wherein at least one of an amplitude or a pulse width of the first pulse is independently tunable from an amplitude or a pulse width of the second pulse, and
      a third pulse of the plurality of pulses controls a pulse width of the RF envelope generated by the one or more PIN diodes, wherein at least one of an amplitude or a pulse width of the third pulse is independently tunable;
   second circuitry configured to receive and combine the plurality of pulses to generate a drive signal; and
   third circuitry that includes the one or more PIN diodes, wherein the second circuitry delivers the drive signal to drive the one or more PIN diodes included in the third circuitry, and wherein the one or more PIN diodes generate the RF envelope.

8. The RF modulator device of claim 7, wherein the plurality of pulses further includes one or more high pulses to control an on isolation of the one or more PIN diodes, and wherein at least one of an amplitude or a pulse width of the one or more high pulses are independently tunable.

9. The RF modulator device of claim 7, wherein the plurality of pulses further includes one or more low pulses to control an off isolation of the one or more PIN diodes, and wherein at least one of an amplitude or a pulse width of the one or more low pulses are independently tunable.

10. The RF modulator device of claim 7, wherein the first circuitry includes a digital-to-analog converter configured to generate the plurality of pulses from the input.

11. The RF modulator device of claim 7, wherein the first circuitry includes one or more potentiometers.

12. The RF modulator device of claim 11, wherein the one or more potentiometers adjusts the amplitude of the plurality of pulses.

13. The RF modulator device of claim 7, wherein the first circuitry includes one or more operational amplifiers.

14. The RF modulator device of claim 13, wherein the one or more operational amplifiers in combination with one or more discrete digital logic components adjusts the pulse width of the plurality of pulses.

15. The RF modulator device of claim 7, wherein a pulse delay between the input of the first circuitry and generation of the RF envelope by the third circuitry is 150 nanoseconds (ns) or less.

* * * * *